(12) United States Patent
Jensen

(10) Patent No.: US 6,947,877 B2
(45) Date of Patent: Sep. 20, 2005

(54) METHODS FOR OPTIMIZING MAGNETIC RESONANCE IMAGING SYSTEMS

(75) Inventor: Jens Jensen, Yonkers, NY (US)

(73) Assignee: New York University, New York, NY (US)

(*) Notice: Subject to any disclaimer, the term of this patent is extended or adjusted under 35 U.S.C. 154(b) by 898 days.

(21) Appl. No.: 09/732,322

(22) Filed: Dec. 7, 2000

(65) Prior Publication Data

US 2002/0143504 A1 Oct. 3, 2002

(51) Int. Cl.$^7$ ............................ G06F 17/10; A61B 5/05
(52) U.S. Cl. ............................................ 703/2; 600/422
(58) Field of Search ....................... 703/2, 13; 600/410, 600/422; 324/307, 309, 318, 320, 322

(56) References Cited

U.S. PATENT DOCUMENTS

| | | | |
|---|---|---|---|
| 5,664,568 A | 9/1997 | Srinivasan et al. | 128/653.2 |
| 5,706,813 A | 1/1998 | Filler et al. | 128/653.5 |
| 6,255,929 B1 | 7/2001 | Xu et al. | 335/299 |

OTHER PUBLICATIONS

Alton et al., G.D. A High–Temperature , "Volume–Type", ECR Ion Source for RIB Generation, Proceedings of the 1999 Particle Accelerator Conference, IEEE, Mar.–Apr. 1999, pp. 1881–1883.*
Christensen et al., T.C., Development of a Laced Electromagnetic Wiggler, IEEE Transactions on Magnetics, vol. 24, No. 2, Mar. 1988, pp. 1094–1097.*
Chapman et al., B.L.W. Optimized Electromagnetic Coil Design Theory, IEEE, Southeastcon '92, Apr. 1992, pp. 757–762.*
M. Kitamura, S. Kakukawa, K. Mori, and T. Tominaka, "An optimal design technique for coil configurations in iron-shielded MRI magnets", IEEE Tran. Magn., vol. 30, No. 4, pp. 2352–2355, 1994.
H. Xu, S. M. Conolly, G. C. Scott, and A. Macovski, "Homogeneous magnet design using Linear programming", IEEE Trans. Magn., vol. 36, No. 2, pp. 476–483, 2000.
J. H. Jensen, "Optimization method for permanent–magnet structures", IEEE Trans. Magn., vol. 35, No. 6, pp. 4465–4472, 1999.
M. W. Garrett, "Thick cylindrical coil systems for strong magnetic fields with field or gradient homogeneities of the 6th to 20th order", J. Appl. Phys., vol. 38, No. 6, pp. 2567–2591, 1967.
S. Crozier and D. M. Doddrell, "Compact MRI magnet design by stochastic optimization," J. Magn. Reson., vol. 127, pp. 233–237, 1997.
R. V. Churchhill, J. W. Brown, and R. F. Verhey, Complex Variables and Applications, New York: McGraw–Hill, 1974 pp. 286–287.
S. Kakugawa et al., A Study on Optimal Coil Configurations in a Split–Type Superconducting MRI Magnet, (1999) IEEE vol. 9, No. 2, pp. 366–367.

* cited by examiner

Primary Examiner—Russell Frejd
(74) Attorney, Agent, or Firm—Darby & Darby

(57) ABSTRACT

A computer-implemented method for optimizing the design of an electromagnetic coil arrangement that generates a uniform magnetic field in a desired region, with the electromagnetic coil arrangement having a number of coils and a shape defined by r and z, where r is the radial coordinate of a cylindrical coordinate system having (r, z, φ) coordinates, and z is the axial coordinate of the cylindrical coordinate system. The method has an important use for designing superconductive or resistive coil arrangements for MRI systems. The core of the method is to compute a solution to a master equation (25) for a set of parameters lambda_j which define the coil arrangement and the currents needed. An important advantage is that the resultant coil arrangement has a minimum volume, which saves on material, or uses a minimum power.

14 Claims, 11 Drawing Sheets

METHODS FOR OPTIMIZING MAGNETIC RESONANCE IMAGING SYSTEMS

This invention relates to methods for designing electromagnetic coil arrangements that generate uniform magnetic fields, and in particular for optimizing electromagnetic coil arrangements for magnetic resonance imaging (MRI) systems.

IA. BACKGROUND OF THE INVENTION

Electromagnets with axially symmetric coil arrangements are commonly used for the generation of uniform magnetic fields. By "uniform field" is meant a magnetic field whose intensity over a desired region does not vary more than 100 parts per million (ppm). An important application nowadays is the medical use of MRI where the desired region is often referred to as the imaging region. MRI of a human body or body part requires large magnets. The magnets may be composed of superconductive materials or of resistive materials. A natural design criterion is that the volume of the coils be as small as possible, consistent with a set of prescribed constraints, since the volume of the coils often correlates closely with a magnet's weight, cost, and power consumption. This is especially important for superconducting magnets since their cost depends strongly on the amount of superconducting wire required, and the necessity for artificial cooling of the magnet coils down to the critical temperature at which superconducting behaviour is achieved.

Many difficulties are encountered in such a magnet design problem, and many solutions have been proposed. The various proposed solutions exhibit one or more disadvantages. For example, the problem of volume minimization of electromagnetic coil systems has been considered previously by Kitamura et al, M. Kitamura, S. Kakukawa, K. Mori, and T. Tominaka, "An optimal design technique for coil configurations in iron-shielded MRI magnets," IEEE Tran. Magn., vol. 30, no. 4, pp. 2352–2355, 1994, ("Kitamura"), and by Xu et al, H. Xu, S. M. Conolly, G. C. Scott, and A. Macovski, "Homogeneous magnet design using linear programming," IEEE Trans. Magn., vol. 36, no. 2, pp. 476–483, 2000 ("Xu"). For simplicity, when discussion of a particular reference is needed or desirable, it may be identified by the name of the lead author. The reader is urged if needed to review these references for a more complete discussion of the various known methods and their pros and cons and for a more complete understanding of the methods described herein. While the methods disclosed by Kitamura and Xu have benefits, they also have requirements that are undesirable. For example, the method of Kitamura assumes unidirectional currents in the coils, while the method of Xu requires that the length-to-width ratio of the coils be specified. Therefore, neither approach determines, in general, the minimum volume solution, as is defined in this invention. It is also noted that a variety of procedures for optimizing electromagnets have been described that utilize criteria other than coil volume minimization; for a review of these the reader is to Xu.

IB. SUMMARY OF THE INVENTION

An object of the invention is a new computer-implemented method for designing electromagnetic coil arrangements that generate uniform magnetic fields.

Another object of the invention is a computer-implemented method for designing electromagnetic coil arrangements that generate uniform magnetic fields, which method will accurately and efficiently determine an arrangement that minimizes the volume of the coils.

Yet another object of the invention is a computer-implemented method for designing electromagnetic coil arrangements that generate uniform magnetic fields, which method will minimize the power consumption of resistive coils.

A further object of the invention is a computer-implemented method for designing electromagnetic coil arrangements that generate uniform magnetic fields, which method guarantees will always find a global minimum.

In accordance with one aspect of the present invention, a practical numerical method is described of precisely determining, in many cases, minimum volume coil arrangements. An important advantage of the method is that the solutions it generates are guaranteed to be global, rather than merely local, minimums.

The method requires that four basic assumptions be made. First, the coils have a given current density that is the same for all the coils and homogeneous throughout each coil. This condition means that the coils may be connected in series with a uniform wire size and turn density. Second, the coils are restricted to lie within a specified domain (the feasible volume), which may be chosen freely in order to satisfy any desired access demands and size limitations. Third, the magnetic field depends linearly on the current density. Hence, the method does not apply to magnets containing material with nonlinear magnetic properties. Fourth, the characteristics of the field, such as its magnitude and uniformity, may be fixed by imposing on the field a set of linear inequality constraints.

The number of coils and their cross-sectional shapes are determined by the method rather than being given a priori. The coils of a true minimum volume solution will usually have nonrectangular cross sections. In accordance with another aspect of the invention, in order to obtain arrangements with only rectangular coils, which are easier to implement, an auxiliary condition may be imposed on the current density. This leads to solutions that closely approximate the true minimum volume solution.

As with those of Kitamura and Xu, the method described here employs linear programming (LP) computation using a computer. However, a straightforward application of linear programming may not, by itself, be a practical approach for accurately calculating minimum volume coil arrangements. The reason for this is that the memory requirements and computational time for a linear programming computation increase rapidly as one increases the number of numerical grid points used to represent the feasible volume. See the discussion in Xu. To circumvent this problem, I first use linear programming with a sparse grid to obtain a coarse grained solution. This solution is then refined by numerically solving with a computer a set of nonlinear equations. The solving of these equations on a dense grid is feasible, because the memory requirements and computational time increase only linearly with the number of grid points.

The method of the invention is useful for designing both superconducting and resistive electromagnets. While minimizing the coil volume is often of central importance for large superconducting magnets, for large resistive magnets, minimization of the power consumption is typically a primary design goal. For a given current density, the minimum power and minimum volume coil arrangements are the same. By computing the minimum volume solution for a range of current densities, the arrangement needing the absolute minimum amount of power can be found.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention.

IC. BRIEF DESCRIPTION OF THE DRAWINGS

ID. DETAILED DESCRIPTION OF THE PREFERRED EMBODIMENTS

I will first define in Section II a statement of the problem in appropriate mathematical terms; I will next provide in Section III the mathematical background for one skilled in this art to understand my new method; I will then describe in Section IV my method for minimizing coil volume including various optional steps for certain purposes; I will then describe in Section V my method for minimizing power; next; I will describe in Sections VI and VII some examples and results in comparison with other proposed solutions and some remarks; and finish in Section VIII with some summarizing comments. Following Section VIII are Section IX, labeled Mathematical Proofs, Section X, labeled Tables I, II, and III, and finally the claims and Abstract.

II. STATEMENT OF PROBLEM

I define a system of cylindrical coordinates (r, z, $\phi$) that are related to a conventional (x, y, z) rectangular system by $$x = r \cos \phi,$$
$$y = r \sin \phi,$$
$$z = z. \tag{1}$$

Now consider an electromagnet that is rotationally symmetric with respect to the z axis. The magnet's current density is assumed to be oriented parallel to the $\phi$ direction and is specified by a function J(r, z). The spatial extent of the current is restricted so that J(r, z) is allowed to be nonzero only on a specified domain D of the rz plane, which corresponds to the feasible volume for the coils (see FIG. 1).

The magnetic field generated by the magnet is given by D. B. Montgomery, *Solenoid Magnet Design*. New York: Wiley, 1969 ("Montgomery")

$$B_r(r, z) = 2\pi \int_D r' dr' dz' G_r(r, r', z-z') J(r', z'),$$
$$B_z(r, z) = 2\pi \int_D r' dr' dz' G_z(r, r', z-z') J(r', z'),$$
$$B_\phi(r, z) = 0, \tag{2}$$

where $B_r$, $B_z$ and $B_\phi$ are the cylindrical components. The functions $G_r$ and $G_z$ are defined by $$G_r(r_a, r_b, z) = \tag{3}$$

$$\frac{\mu_0 z}{4\pi^2 r_a r_b \sqrt{(r_a + r_b)^2 + z^2}} \left[ -K(k) + \frac{r_a^2 + r_b^2 + z^2}{(r_a - r_b)^2 + z^2} E(k) \right],$$

$$G_z(r_a, r_b, z) = \frac{\mu_0}{4\pi^2 r_b \sqrt{(r_a + r_b)^2 + z^2}} \left[ K(k) - \frac{r_a^2 - r_b^2 + z^2}{(r_a - r_b)^2 + z^2} E(k) \right],$$

where $\mu_0 = 4\pi \times 10^{-7}$ T·m/A is the free space permeability, K(k) and E(k) are the complete elliptic integrals of the first and second kinds, and $$k = \left[ \frac{4 r_a r_b}{(r_a + r_b)^2 + z^2} \right]^{1/2}. \tag{4}$$

Figure 1:
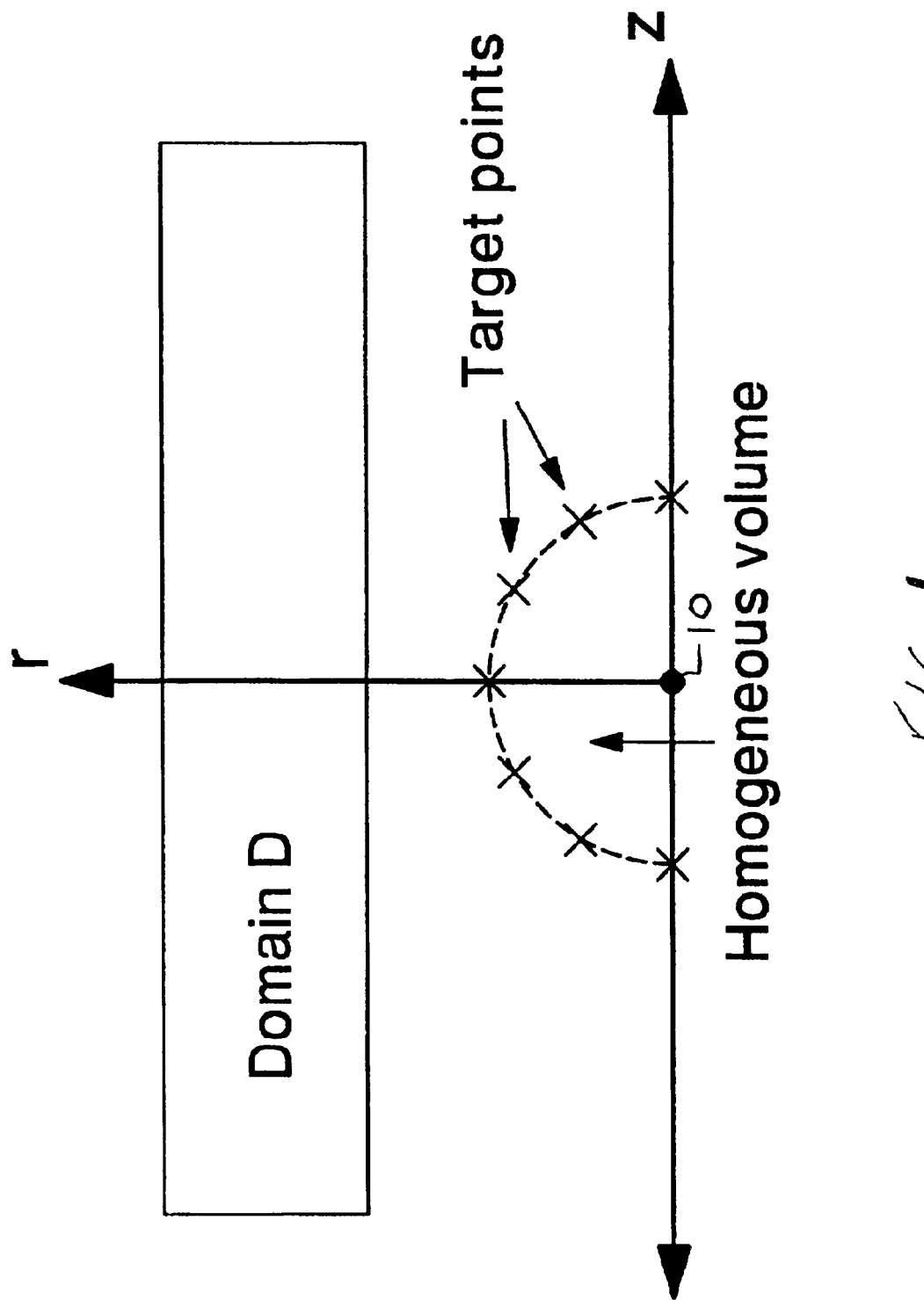
FIG. 1 illustrates the domain D of the rz plane of a cylindrical coordinate system as explained below, where D may be freely chosen to satisfy any desired access and size limitations.

I assume that the region with a high degree of field uniformity (the homogeneous volume) is centered on the z axis, as illustrated in FIG. 1. Within this region, as discussed by Xu et al. [2], $B_r$ may be neglected, and it is therefore sufficient to impose constraints just on $B_z$. For a set of $M_h$ target points, $(r_j, z_j)$, $j=1, 2, \ldots, M_h$, I demand $$(1-\epsilon) B_0 \leq B_z(r_j, z_j) \leq (1+\epsilon) B_0, \tag{5}$$

where $B_0$ is the desired field strength. This condition implies that the peak-to-peak field variation at the target points is less than or equal to $2\epsilon$. Typically, the target points are placed on the surface of the homogeneous volume; if enough equally-spaced target points are used, then the field variation within the homogeneous volume will also be less than $2\epsilon$. In practice, $\epsilon$ is usually in the range of $10^{-6}$ to $10^{-4}$, corresponding to uniformities of 2 to 200 parts per million (ppm), and the necessary number of target points $M_h$ may vary from 5 to 50.

Optionally, an additional set of $M_f$ target points, $(r_j, z_j)$, $j = M_h+1, M_h+2, \ldots, M_h+M_f$, may be employed to control the magnet's fringe field outside of the coils. At these points, I require $$-B_{r,f} \leq B_r(r_j, z_j) \leq B_{r,f},$$
$$-B_{z,f} \leq B_z(r_j, z_j) \leq B_{z,f} \tag{6}$$

For conventional active shielding, the target points would normally be chosen to lie on a surface outside of which the field should have a magnitude of less than $5 \times 10^{-4}$ T (5 G). Values for $B_{r,f}$ and $B_{z,f}$ would then be selected so that $$\sqrt{B_{r,f}^2 + B_{z,f}^2} \approx 5 \times 10^{-4} \, T. \tag{7}$$

Adequate control of the fringe field can often be attained with 5 or fewer target points.

Because $B_r$ and $B_z$ depend linearly on J, as indicated by Eq. (2), Eqs. (5) and (6) constitute a set of linear inequality constraints on J. In addition, I assume that throughout the domain D $$|J(r, z)|=J_0 \text{ or } 0, \qquad (8)$$

where $J_0$ is given. This simply means that the current density of the coils must have a uniform, prescribed magnitude.

The condition of Eq. (8) allows the volume V of the coils to be written $$V = \frac{2\pi}{J_0} \int_D r\, dr\, dz |J(r, z)|. \qquad (9)$$

The primary problem is to find $J(r, z)$ so that V is minimized subject to the conditions of Eqs. (5), (6), and (8). I call this minimum volume solution the ideal current density.

Implementation of an ideal current density would generally require a magnet with nonrectangular coils. Since this can make fabrication difficult, I have as a secondary problem the task of finding a solution that: satisfies conditions (5), (6), and (8); can be implemented with only rectangular coils; and has a volume close to that of the ideal current density. This can be formalized by dividing D into a set of K rectangular subregions $D_k$, k=1, 2, ..., K. Two sides of each subregion are oriented to be parallel to the z axis and extend, for the kth subregion, from $z=Z_{a,k}$ to $z=Z_{b,k}$. I then impose the auxiliary condition $$J(r, z) = \int_{Z_{a,k}}^{Z_{b,k}} dz' J(r, z')/(Z_{b,k}-Z_{a,k}), (r, z) \in D_k, k=1, 2, \ldots, K. \quad (10)$$

Equation (10) means that, within each subregion, J is independent of z, which guarantees that the solution can be constructed with rectangular coils. In order to achieve a small coil volume, the subregions $D_k$ are patterned after the ideal solution, in a manner to be discussed. Usually, a relatively simple subdivision of D is sufficient to come within a few percent of the ideal minimum volume.

III. MATHEMATICAL BACKGROUND

The method for determining the current density J is founded on three principal mathematical theorems. Here I state these theorems, leaving their proofs for Section IX below.

A. Theorem 1: Equivalent Form

The problem of finding the ideal current density can be recast as the minimization of the quantity $$V' = \frac{2\pi}{J_0} \int_D r\, dr\, dz\, U(r, z) \qquad (11)$$

subject to Eqs. (5), (6), and the conditions $$-U(r, z) \leq J(r, z) \leq U(r, z), \qquad (12a)$$

$$-J_0 \leq J(r, z) \leq J_0, \qquad (12b)$$

with both the functions J and U being allowed to vary. The solution that minimizes V' will always have $U=|J|$ so that V' equals the minimum possible volume for the coils. The advantage of this form of my problem is that V' and all of the constraints depend linearly on U and J, which allows one to apply linear programming techniques [4,5].

I note that this formulation has some similarities to, but is not identical to, ones presented by Kitamura and by Xu. For instance, J is assumed to be nonnegative in Kitamura, while the condition of Eq. (12b) is not utilized is Xu.

B. Theorem 2: Uniqueness

The problem of minimizing the volume V, as defined by Eq. (9), subject to the conditions of Eqs. (5), (6), and (8) has at most one solution. Therefore the ideal current density (when it exists) is unique.

C. Theorem 3: Minimization with Equality Constraints

Consider minimizing the volume V, as defined by Eq. (9), subject to the condition of Eq. (8) and the M linear equality constraints $$2\pi \int_D r\, dr\, dz\, g_j(r, z) J(r, z) = c_j, \text{ for } j=1, 2, \ldots, M, \qquad (13)$$

where the $c_j$ are a given set of constants and the $g_j$ are a set of given constraint functions. The solution is $$J(r, z) = J_0 \Theta\left[\left|\sum_{j=1}^M \lambda_j g_j(r, z)\right| - \lambda_0\right] \frac{\sum_{j=1}^M \lambda_j g_j(r, z)}{\left|\sum_{j=1}^M \lambda_j g_j(r, z)\right|}, \qquad (14)$$

provided values for the $\lambda_j$ are chosen so that Eq. (13) is satisfied. In Eq. (14), $\Theta$ is the Heaviside step function defined by $$\Theta(x) = \begin{cases} 1, & \text{if } x > 0, \\ 0, & \text{if } x < 0. \end{cases} \qquad (15)$$

This theorem shows how the minimization of V with equality constraints can be reduced to solving a system of nonlinear equations for the $\lambda j$. These equations are obtained (as is discussed below) by combining Eqs. (13) and (14). A somewhat related result has been previously derived by me for permanent magnet structures J. H. Jensen, "Optimization method for permanent-magnet structures," IEEE Trans. Magn., vol. 35, no. 6, pp. 4465–4472, 1999 ("Jensen"). However, the equations and assumptions of that earlier development for a permanent magnet structure are not applicable to the electrical coil arrangements which can be designed using the methods and concepts of the present invention which are not disclosed in Jensen. A useful corollary of the present invention is that a solution with $\lambda_0=0$ must have $J_0$ equal to the smallest current density magnitude that is consistent with the conditions of Eqs. (8) and (13).

IV. METHOD

To understand what follows, consider annexed FIG. 1, which is similar to FIG. 1 of Xu et al. In FIG. 1, the domain D is the region of an rz plane corresponding to the feasible volume of the imaging region (also referred to as the homogeneous volume). The arbitrarily shaped homogeneous volume is specified by a set of target points on the surface of the homogeneous volume. The current density J is restricted to the domain D of the rz plane. D may be freely chosen to satisfy any desired access and size limitations. The homogeneous volume is centered on the origin designated 10 and is fixed by imposing the inequality constraints of Eq. (5) on the z component of the magnetic field for a set of $M_h$ target points.

Figure 2:
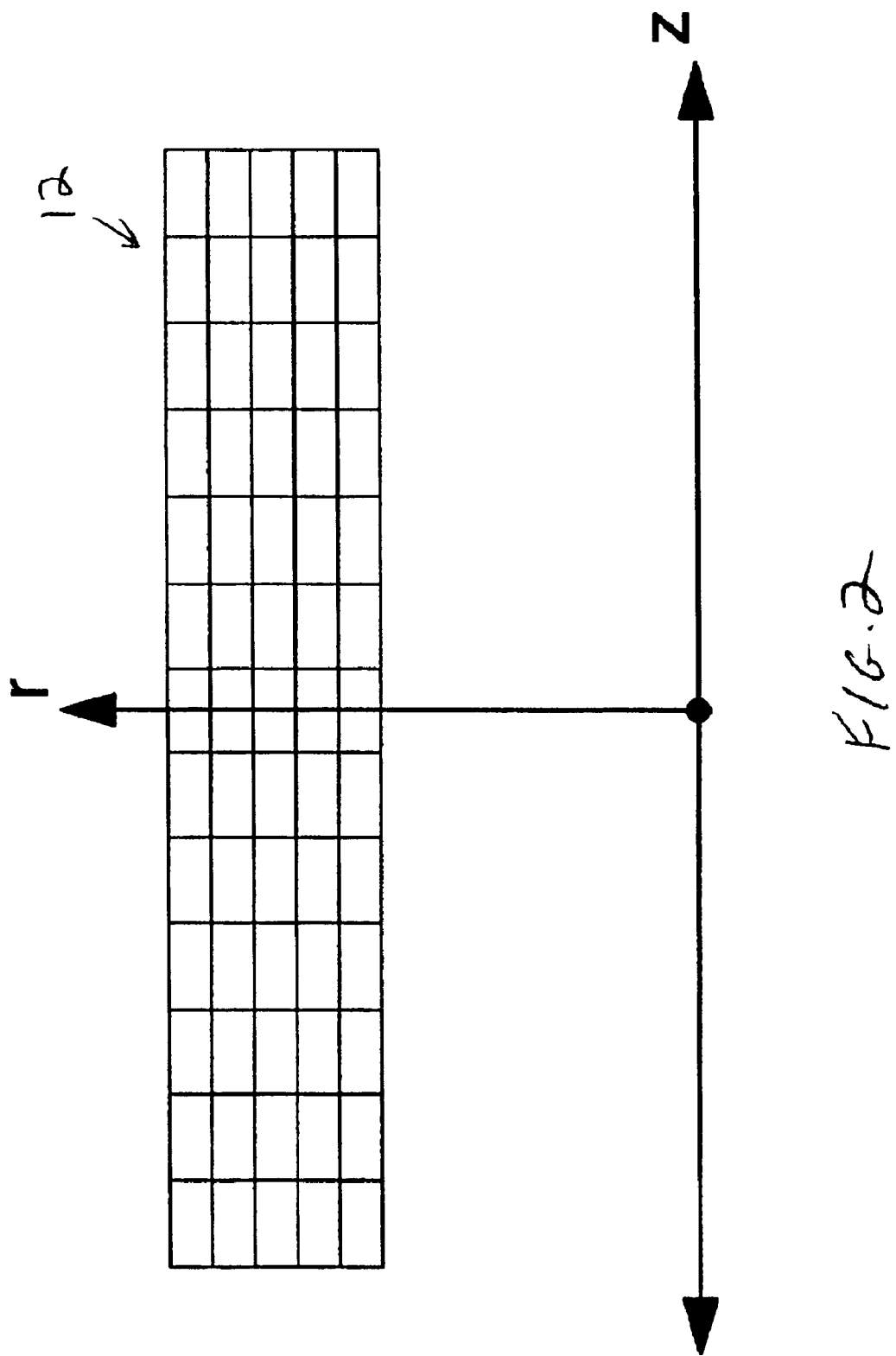
FIG. 2 shows the domain D represented with a grid of N points.

In order to calculate the ideal current density, I represent the domain D with a numerical grid of N points, as suggested by FIG. 2. For the initial steps of the calculation, a sparse grid with a small number of points is used. The number of points is increased for the final stages to obtain an accurate solution. Typically, the final grid will consist of several thousand points.

A. Step 1: Linear Programming

With the introduction of the numerical grid, the form of the problem given by Theorem 1 becomes a standard linear programming problem as described in G. Hämmerlin and K.-H. Hoffman, Numerical Mathematics. New York: Springer-Verlag, 1991 ("Hammerlin"); and W. H. Press, S. A. Teukolsky, W. T. Vetterling, and B. P. Flannery, Numerical Recipes in C: The Art of Scientific Computing, New York: Cambridge University Press, 1992 ("Press"). The functions J and U may be regarded as N-dimensional vectors and the optimization problem has 2N degrees of freedom. The total number of inequality constraints, corresponding to Eqs. (5), (6), and (12), is $4N+2M_h+4M_f$.

A variety of algorithms have been proposed for solving linear programming problems, with the most popular being the simplex method Hammerlin, Press. All of these are usable in my invention, but I prefer to use a double precision version of a simplex method subroutine given in Press and have found it to be effective when N is a few hundred or less. For larger values of N, three problems arise. First, the method requires sufficient memory for a matrix with approximately $8N^2$ elements or about $64N^2$ bytes. On many computers, this limits N to no more than a few thousand. Second, if $\epsilon$ is small, as is the case when the homogeneous region is required to have a high degree of uniformity, then numerical rounding errors become important. In practice, I have found that this often restricts N to be less than one thousand. Finally, the average computational time scales roughly as $N^3$, which again can make large values of N impractical.

To be sure, these difficulties are to some extent algorithm dependent. In principle, both the memory and rounding problems could be largely circumvented, but at the price of a longer computational time. However, no linear programming algorithm has been proposed with a computational time that, on average, grows substantially more slowly with N than the simplex method Hammerlin. Thus, a straightforward application of linear programming to the determination of the ideal current density is likely to be limited to sparse grids.

B. Step 2: Reformulation as Equality Constraint Problem

In order to compute the current density on a denser grid, I first reformulate the problem as one with equality, rather than inequality, constraints. The basic assumption is that the coarse-grained solution obtained with linear programming yields an adequate approximation for the field in the homogeneous volume and for the fringe field.

Inside the homogeneous volume, I expand $B_z$ as $$B_z(r, z) = \sum_{j=1}^{N_h} a_j \rho^{j-1} P_{j-1}(z/\rho), \tag{16}$$

where $\rho = \sqrt{r^2+z^2}$ and $P_j$ is a Legendre polynomial, and I expand the fringe field as $$B_z(r, z) = \sum_{j=1}^{N_f} b_j \rho^{-(j+2)} P_{j+1}(z/\rho). \tag{17}$$

The expansion coefficients, $a_j$ and $b_j$, are calculated by using the linear programming solution with the number of terms, $N_h$ and $N_f$, being chosen to give a sufficiently accurate representation of the field. Often, $N_h \leq 20$ and $N_f \leq 5$ are satisfactory.

I could also expand $B_r$ in a similar fashion, but this is not necessary since $B_r$ is fully determined by $B_z$. To see this, note that the vanishing of the divergence of the magnetic field implies $$\frac{1}{r}\frac{\partial[rB_r(r,z)]}{\partial r} = -\frac{\partial B_z(r,z)}{\partial z}. \tag{18}$$

This, together with the boundary condition $B_r(0,z)=0$, leads to $$B_z(r, z) = -\frac{1}{r}\int_0^r r' dr' \frac{\partial B_z(r', z)}{\partial z}. \tag{19}$$

The determination of the current density can now be reduced to a minimization problem with equality constraints of the type described in Theorem 3. Specifically, there are $M=N_h+N_f$ constraints of the form given by Eq. (13) with $$c_j = a_j, \text{ for } j=1, 2, \ldots, N_h,$$

$$c_{(N_h+j)} = b_j, \text{ for } j=1, 2, \ldots, N_f, \tag{20}$$

and $$g_j(r, z) = \frac{\mu_0}{4\pi r} \cdot \frac{j(j+1)}{(2j+1)} \cdot \frac{1}{\rho^j}[P_{j-1}(z/\rho) - P_{j+1}(z/\rho)], \tag{21}$$

for $j = 1, 2, \ldots, N_h$, $$g_{(N_h+j)}(r, z) = \frac{\mu_0}{4\pi r} \cdot \frac{j(j+1)}{(2j+1)} \rho^{j+1}[P_{j-1}(z/\rho) - P_{j+1}(z/\rho)],$$

for $j = 1, 2, \ldots, N_f$.

The expressions for the $g_j$ may be derived with the help of Eqs. (2)–(4).

C. Step 3: Nonlinear System

Following Theorem 3, I seek a solution of the form of Eq. (14). This form is invariant under the transformation $\lambda_j \to s\lambda_j$, where s is any positive constant. This allows one to impose, without loss of generality, the normalization requirement $$\sum_{j=0}^{M} \lambda_j^2 = 1. \tag{22}$$

Now define a set of M+1 functions $F_m$, m=0, 1, ..., M, so that $$F_0(\lambda_j) = 1 - \sum_{j=0}^{M} \lambda_j^2, \qquad (23)$$

and $$F_m(\lambda_j) = c_m - 2\pi J_0 \int_D r\,dr\,dz\, g_m(r,z) \Theta\left[\left|\sum_{j=1}^{M} \lambda_j g_j(r,z)\right|\right] - \lambda_0 \sum_{j=1}^{M} \frac{\lambda_j g_j(r,z)}{\left|\sum_{j=1}^{M} \lambda_j g_j(r,z)\right|}, \qquad (24)$$

for $m=1, 2, \ldots, M$. The conditions of Eqs. (13) and (22) may then be expressed as $$F_m(\lambda_j) = 0, \text{ for } m=0, 1, \ldots, M. \qquad (25)$$

Therefore, the determination of the $\lambda_j$, and hence the ideal current density J, has been reduced to the solution of a nonlinear system of M+1 equations.

There are a number of known standard numerical methods for solving equations of the form of Eq. (25) (See Press). All of these can be used in accordance with my invention. However, for this particular problem, I have found an iterative approach, similar to one described in Jensen, to be especially effective. In order to employ this method, Eq. (25) must be recast into a different form. Let me define an (M+1)×M+1) matrix.

$$A_{ml}(\lambda_j, \delta) = 2\pi \sum_{\mu=1}^{2} \int_D r\,dr\,dz\, \frac{f_{m,\mu}(r,z) f_{l,\mu}(r,z)}{\left[\left|\sum_{j=0}^{M} \lambda_j f_{j,\mu}(r,z)\right|^2 + \delta^2\right]^{1/2}}, \qquad (26)$$

for both m and l running from 0 to M. In Eq. (26), $\delta$ is a small regularization parameter that keeps the denominator of the integrand from vanishing, and $$f_{0,\mu}(r,z) = \frac{1}{2}, \qquad (27)$$

$$f_{m,\mu}(r,z) = (-1)^{\mu+1} \frac{1}{2} g_m(r,z), \text{ for } m = 1, 2, \ldots, M.$$

From Eqs. (13), (14), (A16), (A19), and (A20), one can show that $$c_m = J_0 \lim_{\delta \to 0} \sum_{l=0}^{M} A_{ml}(\lambda_j, \delta) \lambda_l, \text{ for } m = 0, 1, \ldots, M. \qquad (28)$$

Here $$c_0 = J_0(V_0 - V), \qquad (29)$$

with $V_0$ being the total feasible volume defined by $$V_0 = 2\pi \int_D r\,dr\,dz. \qquad (30)$$

Since it is invariant under the transformation $\lambda_j \to s\lambda_j$, any solution to Eq. (28) can be normalized to satisfy Eq. (22). Normalized in this way, a solution to Eq. (28) will also be a solution to Eq. (25).

To solve Eq. (28), I compute a sequence of approximations $\lambda_j^{(i)}$ so that $\lambda_j^{(i)} \to \lambda_j$ as $i \to \infty$. Given the ith approximation, the (i+1)th approximation is found by first solving the system of M+1 linear equations $$c_m = J_0 \sum_{l=0}^{M} A_{ml}[\lambda_j^{(i)}, \delta] \tilde{\lambda}_l^{(i+1)} \qquad (31)$$

to obtain a set of parameters $\tilde{\lambda}_l^{(i+1)}$. The parameter $c_0$ may be estimated by using the coarse-grained solution earlier computed from linear programming. The $\tilde{\lambda}_l^{(i+1)}$ are then renormalized to give $$\lambda_j^{(i+1)} = \omega_{i+1} \tilde{\lambda}_j^{(i+1)}, \qquad (32)$$

where $$\omega_{i+1} = \left\{\sum_{j=0}^{M} [\tilde{\lambda}_j^{(i+1)}]^2\right\}^{-1/2}. \qquad (33)$$

This renormalization simply guarantees that Eq. (22) is obeyed. An initial set of values for the $\lambda_j$ may be found by solving the equations $$\sum_{l=0}^{M} A_{ml}^{(0)} \tilde{\lambda}_l^{(1)} = c_m \qquad (34)$$

for the $\tilde{\lambda}_l^{(1)}$, where $$A_{ml}^{(0)} = 2\pi \sum_{\mu=1}^{2} \int_D r\,dr\,dz\, f_{m,\mu}(r,z) f_{l,\mu}(r,z). \qquad (35)$$

The $\lambda_j^{(1)}$ are then found from Eq. (32) with i=0.

In carrying out this procedure, the regularization parameter $\delta$ should be chosen to be as small as permitted by the numerical precision. The use of double precision is advisable. I have found the method to have robust convergence properties with a good approximation often being found with no more than a few hundred iterations. (However, if $\delta$ is too small, numerical round off errors may spoil convergence). To maximize efficiency, I usually first find a solution on a grid with a modest number of points, and then use this solution as the initial approximation for a calculation on a dense grid. In this way, an accurate solution for the ideal current density can be constructed.

As stated above, the parameter $c_0$ is determined from the approximate current density obtained with the linear programming and is therefore not exact. For this reason, the solution obtained by iterating Eqs. (31) and (32) may correspond to a $J_0$ that differs slightly from the desired value.

As follows from Eq. (28), the computed solution's $J_0$ is given by $$J_0 = \sum_{m=0}^{M} c_m \lambda_m \bigg/ \lim_{\delta \to 0} \sum_{m=0}^{M} \sum_{l=0}^{M} A_{ml}(\lambda_j, \delta) \lambda_m \lambda_l. \tag{36}$$

In practice, the difference between the desired $J_0$ and the value obtained with Eq. (36) is frequently negligible. However, a simple one-dimensional search may be used to adjust $c_0$ so that Eq. (36) is consistent, to an arbitrary degree of accuracy, with the desired $J_0$.

The advantage of determining J by solving either Eq. (25) or Eq. (28), as compared to using linear programming, is that both the required memory and the computational time increase only linearly with the number of grid points N. This is because N enters only into the numerical evaluation of the integrals in Eqs. (24), (26), and (35). As a consequence, it is feasible to solve Eqs. (25) and (28) for dense grids consisting of many thousands of points.

D. Step 4: Rectangular Coils

As previously discussed, to determine a current density that can be implemented with only rectangular coils, the domain D is divided into K rectangular subregions, $D_k$, and the auxiliary condition of Eq. (10) is imposed on J. Once the $D_k$ have been defined, Eq. (10) can be satisfied simply by replacing the $g_j$ in Eqs. (13), (14), (24), and (27) with $$\bar{g}_j(r, z) = \int_{Z_{a,k}}^{Z_{b,k}} dz' g_j(r, z')/(Z_{b,k} - Z_{a,k}), \ (r, z) \in D_k, \ k=1, 2, \ldots, K. \tag{37}$$

This follows from inspection of Eq. (14). The current density is then found by repeating Step 3, as described above. (A more detailed discussion of the imposition of auxiliary conditions is given in Jensen.)

A direct calculation shows that when (r, z) lies in the kth subregion the explicit expressions of Eq. (21) should be replaced by $$\bar{g}_j(r, z) = \frac{\mu_0}{4\pi r} \cdot \frac{1}{\Delta Z_k} [\rho_{b,k}^{1-j} S_j(Z_{b,k}/\rho_{b,k}) - \rho_{a,k}^{1-j} S_j(Z_{a,k}/\rho_{a,k})], \tag{38}$$

for $j = 1, 2, \ldots, N_h$, $$\bar{g}_{(N_h+j)}(r, z) = \frac{\mu_0}{4\pi r} \cdot \frac{1}{\Delta Z_k} [\rho_{b,k}^{j+2} T_j(Z_{b,k}/\rho_{b,k}) - \rho_{a,k}^{j+2} T_j(Z_{a,k}/\rho_{a,k})],$$

for $j = 1, 2, \ldots, N_f$, where $\rho_{a,k} = \sqrt{r^2 + Z_{a,k}^2}$ $\rho_{b,k} = \sqrt{r^2 + Z_{b,k}^2}$ $\Delta Z_k = Z_{b,k} - Z_{a,k}$, (39)

and $S_1(x) = x$, $S_j(x) = xP_{j-1} - P_{j-2}(x)$, for $j > 1$, $T_j(x) = xP_{j+1} - P_{j+2}(x)$, for $j > 0$. (40)

The selection of the rectangular subregions $D_k$ is based on the solution obtained for the ideal current density. The part of D for which $J \neq 0$ is divided into a set of geometrically simple pieces. For each piece, I associate a subregion $D_k$ that contains the piece, while being as small as possible (with perhaps a slight margin). It should be emphasized that the $D_k$ must be aligned so that two of their sides are parallel to the z axis. The remaining portion of D, not covered by the $D_k$, may be excluded from the integrals in Eqs. (24), (26), (30) and (35). In most cases, choosing a good subdivision of D is straightforward. An example is given in Sec. VI.

V. MINIMIZATION OF POWER

The basic optimization method I have described minimizes the coil volume for a prescribed current density magnitude $J_0$. For this value of $J_0$, the minimum volume solution also minimizes the power consumption of a resistive electromagnet. To see this, note that the power consumption is given by $$W = \frac{2\pi}{\sigma} \int_D r \, dr \, dz J^2(r, z), \tag{41}$$

where $\sigma$ is the conductivity. From Eqs. (8) and (9), I then find $$W = \frac{1}{\sigma} J_0^2 V. \tag{42}$$

Thus, for a fixed $J_0$, minimizing the volume V is equivalent to minimizing W. However, for different values of $J_0$ the optimal W may vary, and therefore to determine the true minimum power consumption, one must compute W for a range of $J_0$ values. Typically, W as a function of $J_0$ has a single minimum that may be computed with elementary numerical methods.

VI. RESULTS AND EXAMPLES

In order to illustrate the optimization method, I apply it to two different examples. First I compute the minimum volume coil arrangement for a magnet that is comparable to a design proposed in the seminal work M. W. Garrett, "Thick cylindrical coil systems for strong magnetic fields with field or gradient homogeneities of the 6th to 20th order," J. Appl. Phys., vol. 38, no. 6, pp. 2563–2586, 1967 ("Garrett"). In this paper, Garrett gives numerous coil arrangements that generate uniform fields. However, these arrangements are not optimized in any systematic manner. I choose one simple example and demonstrate how my method can lead to an arrangement with the same external geometry, current density magnitude, field strength and homogeneous volume, but with a significantly smaller coil volume. I also consider varying the current density magnitude and show how to minimize the power consumption for resistive coils. As a second example, I minimize the coil volume for a magnet similar to conventional actively shielded superconducting magnets used for whole-body MRI.

The arrangements considered are all symmetrical with respect to the z=0 plane. As a consequence, the expansion coefficients, $a_j$ and $b_j$, vanish automatically for even j. The constraints corresponding to these even order coefficients may then be excluded from the nonlinear system, and all the $\lambda_j$ with even j, except $\lambda_0$ must be zero. While this symmetry simplifies the calculation of the ideal current density, it should be emphasized that it is not a requirement for the application of my method.

A. Comparison with a Garrett Magnet

Figure 3A:
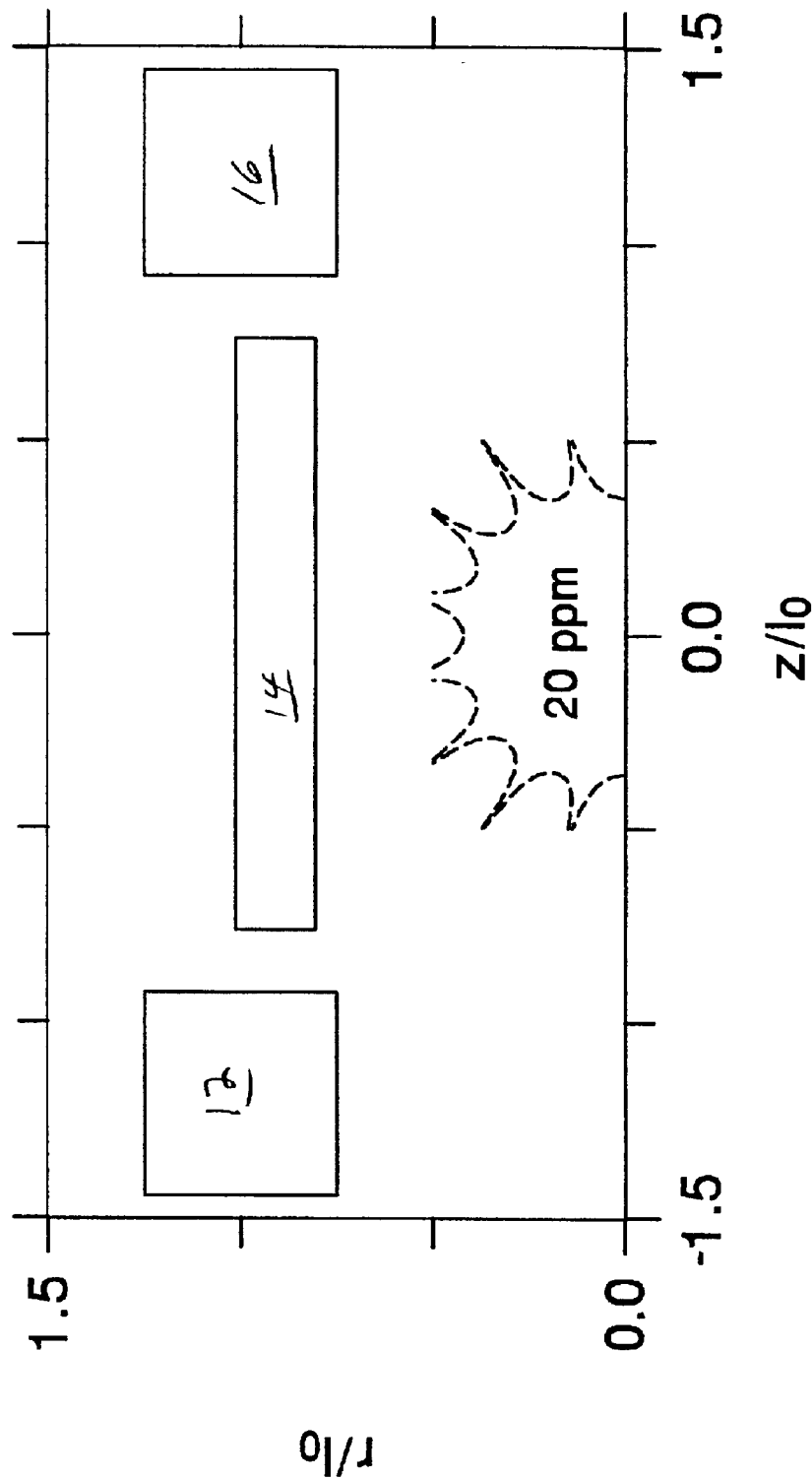
FIGS. 3a shows the design of a Garrett [7] magnet using the Garrett scheme.

FIG. 3a shows a three coil arrangement 12, 14, 16, taken from FIG. 3 and Table XVI of the work of Garrett. The total length of the magnet is 2.8839 $l_0$, the inner radius is 0.75 $l_0$, and the outer radius is 1.25 $l_0$, where to is an arbitrary length scale. The total volume of the coils is $V=5.0813\, l_0^3$. The magnitude of the current density is $J_0=4.9086\, B_0/(\mu_0 l_0)$, where $B_0$ is the desired field strength, and the current flows in the same direction in all of the coils. The homogeneous volume with a 20 ppm peak-to-peak field variation is approximately an oblate spheroid with major and minor semiaxes of $0.42\, l_0$ and $0.36\, l_0$. The coil arrangement is designed to cancel the harmonics of Eq. (16) for $2 \leq j \leq 8$.

Figure 3B:
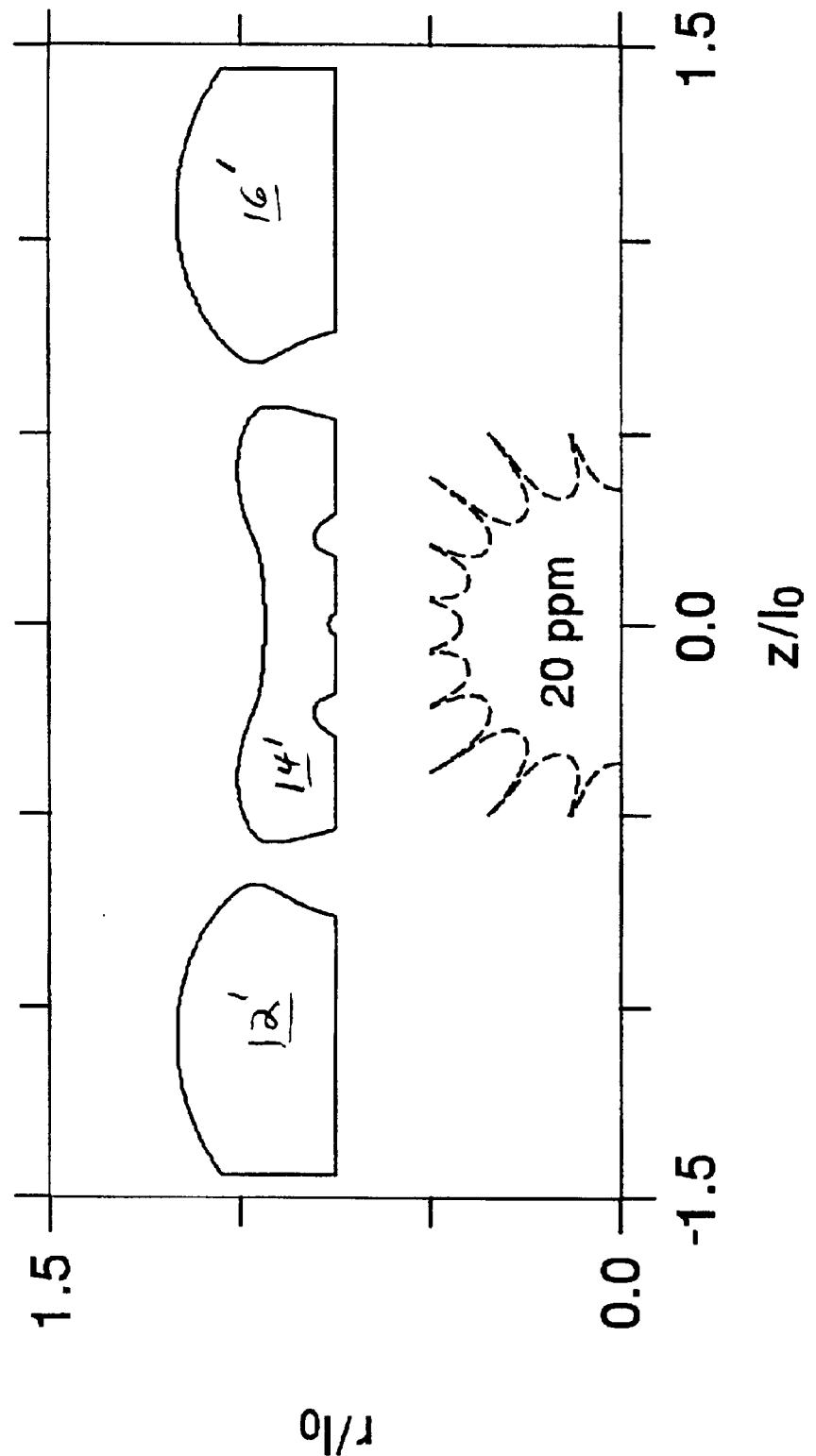
FIGS. 3b shows the design of a comparable magnet using the scheme of my invention which requires 9% less material.

The comparable coil arrangement 12', 14', 16' found by applying steps 1–3 of the optimization method is shown in FIG. 3b. In order to match the external geometry of the Garrett design, the domain D is chosen to be the rectangular region defined by $0.75 l_0 \leq r \leq 1.25 l_0$ and $-1.44195 l_0 \leq z \leq 1.44195 l_0$. The current density magnitude and field strength are also chosen to be the same as for the Garrett magnet. For step 1 (linear programming), the number of target points for the homogeneous volume is $M_h=37$, and $N=41 \times 21 = 861$, where N is the total number of points in the numerical grid; for step 2 (equality constraints), the number of harmonics is $N_h=13$; and for step 3 (the determination of the $\lambda_j$) $N=401 \times 101 = 40{,}501$. Using the $\lambda_j$, the ideal solution of FIG. 3b is found from Eqs. (14) and (21). The total length, inner radius, and homogeneous volume are the same as for the Garrett magnet of FIG. 3a. However, the total volume of the coils is reduced to $V=4.61 l_0^3$, which is a savings of 9%. In addition, the outer radius is reduced to $1.17 l_0$. As with the Garrett solution, the current is unidirectional.

Figure 4A:
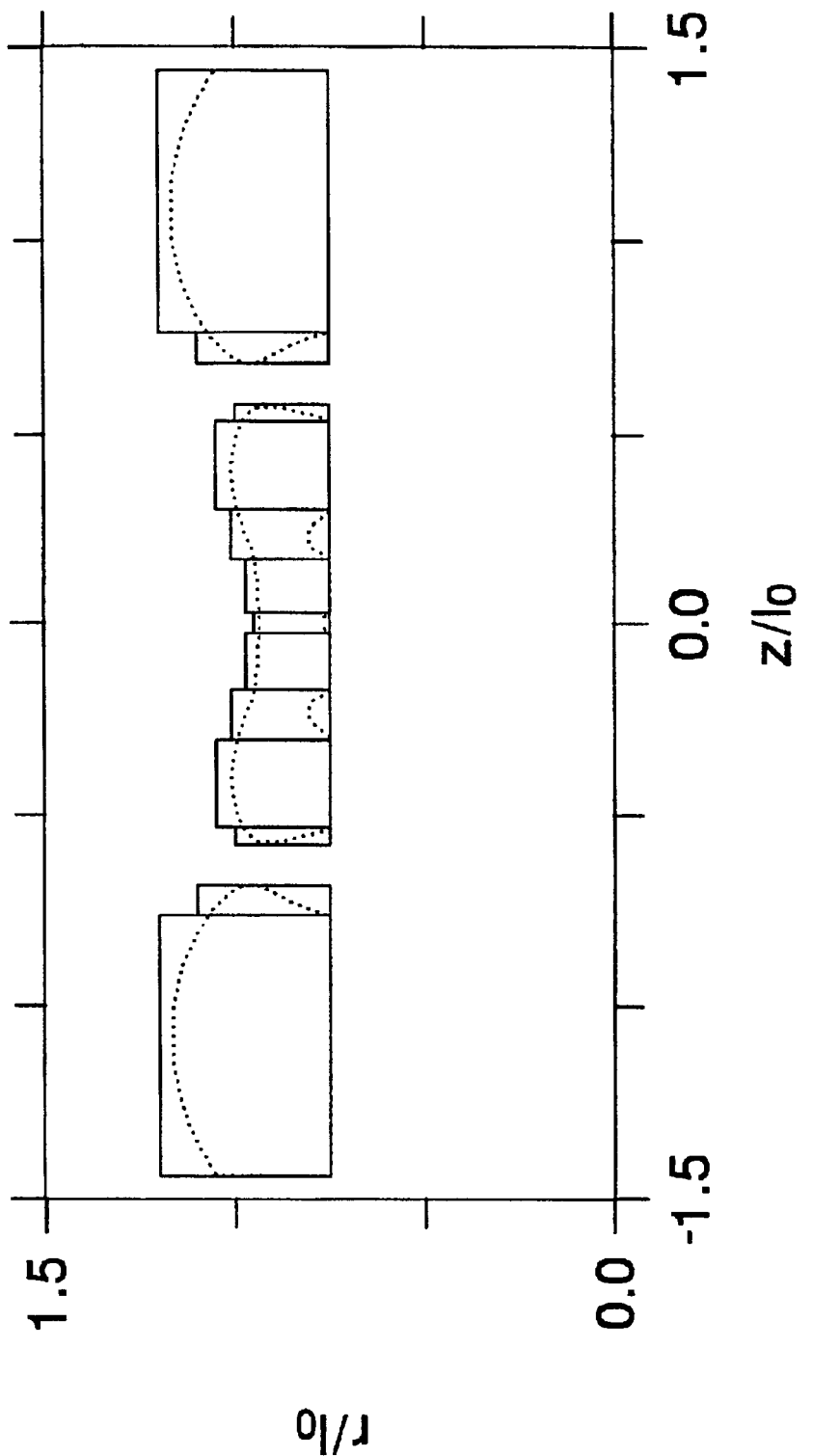
FIG. 4a shows that to determine a rectangular coil arrangement designed according to the invention, the domain D is partitioned in a manner patterned after the ideal solution.
Figure 4B:
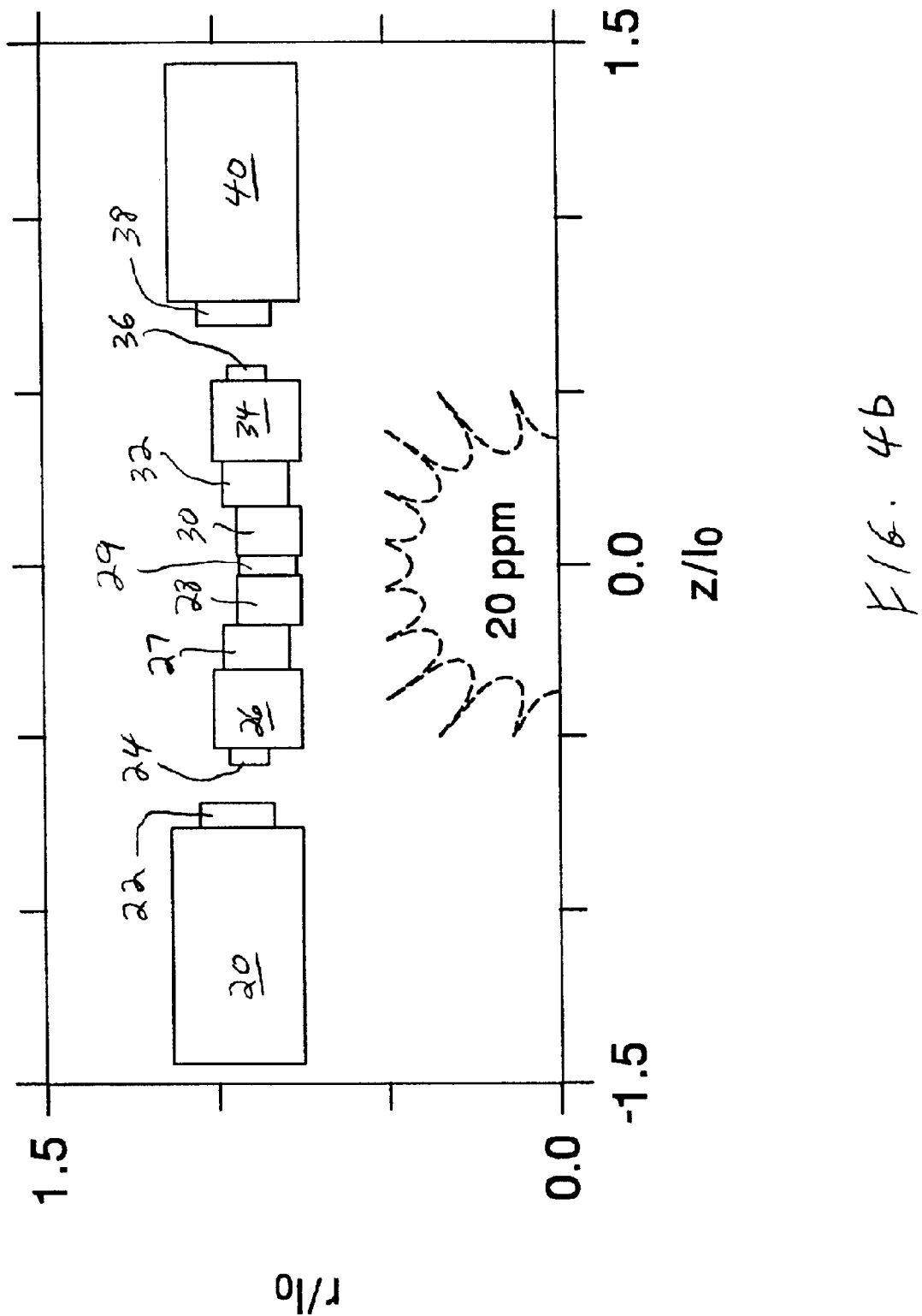
FIG. 4b shows the rectangular coil arrangement with a volume near the minimum when designed according to the invention.

To obtain a design with rectangular coils, I follow step 4 of the optimization procedure and partition the domain D as indicated in FIG. 4a by the 13 rectangles shown. This leads to the coil arrangement shown in FIG. 4b 20–40. In order to obtain a high degree of accuracy, I used $N=70{,}000$. The volume of the coils is $V=4.62\, l_0^3$, which is only slightly larger than that of the ideal solution. The design of FIG. 4b consists of 13 coils. Each coil may be specified by giving the coordinates of the point lying nearest to the origin, $(r_{in}, z_{in})$, and the coordinates of the point lying farthest from the origin, $(r_{out}, z_{out})$. These values are listed in Table I below for the coils that lie in the positive z half-plane.

Figure 5A:
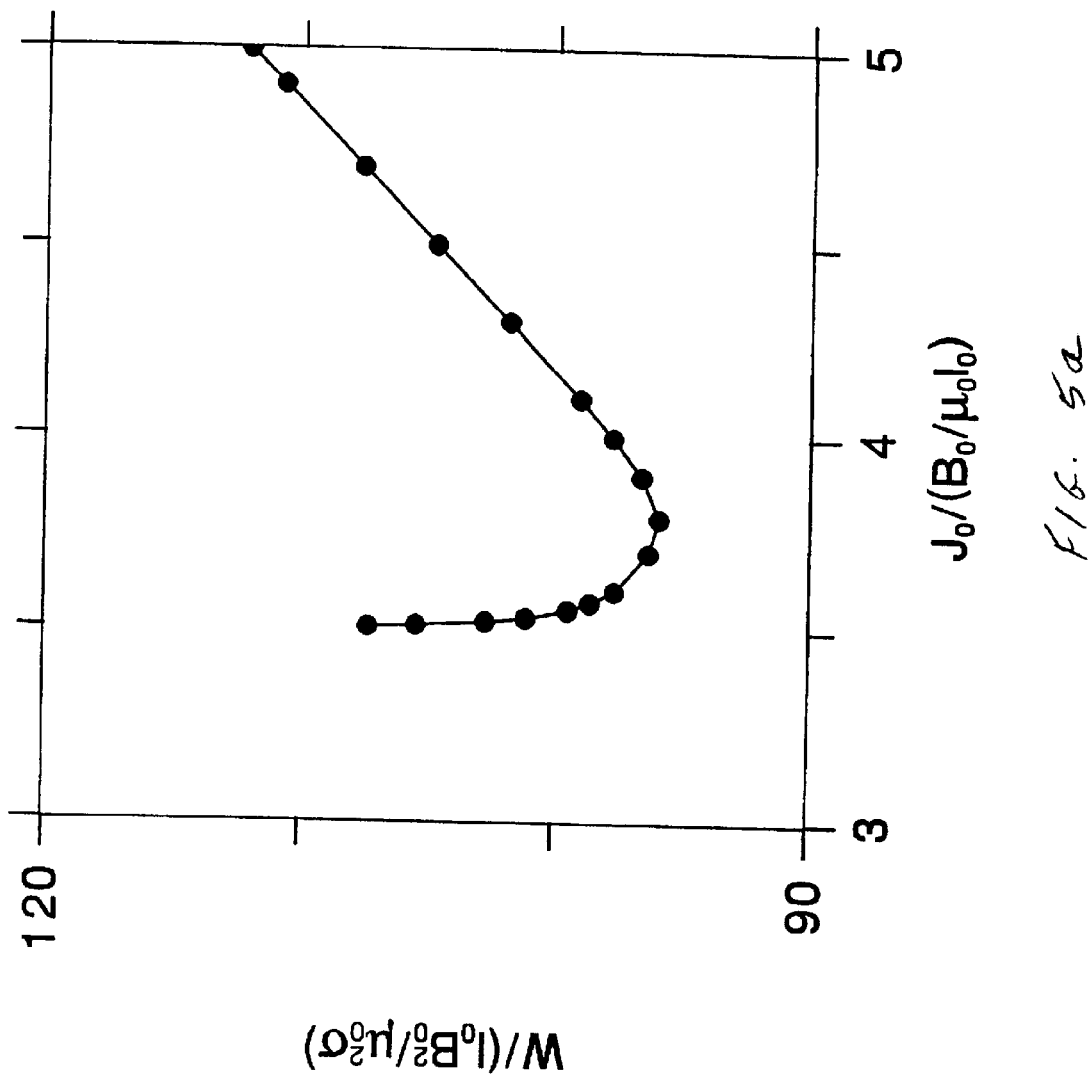
FIG. 5a shows the minimum power W as function of the current density magnitude $J_0$ for a resistive magnet with characteristics similar to that of FIG. 3a designed according to the invention.
Figure 5B:
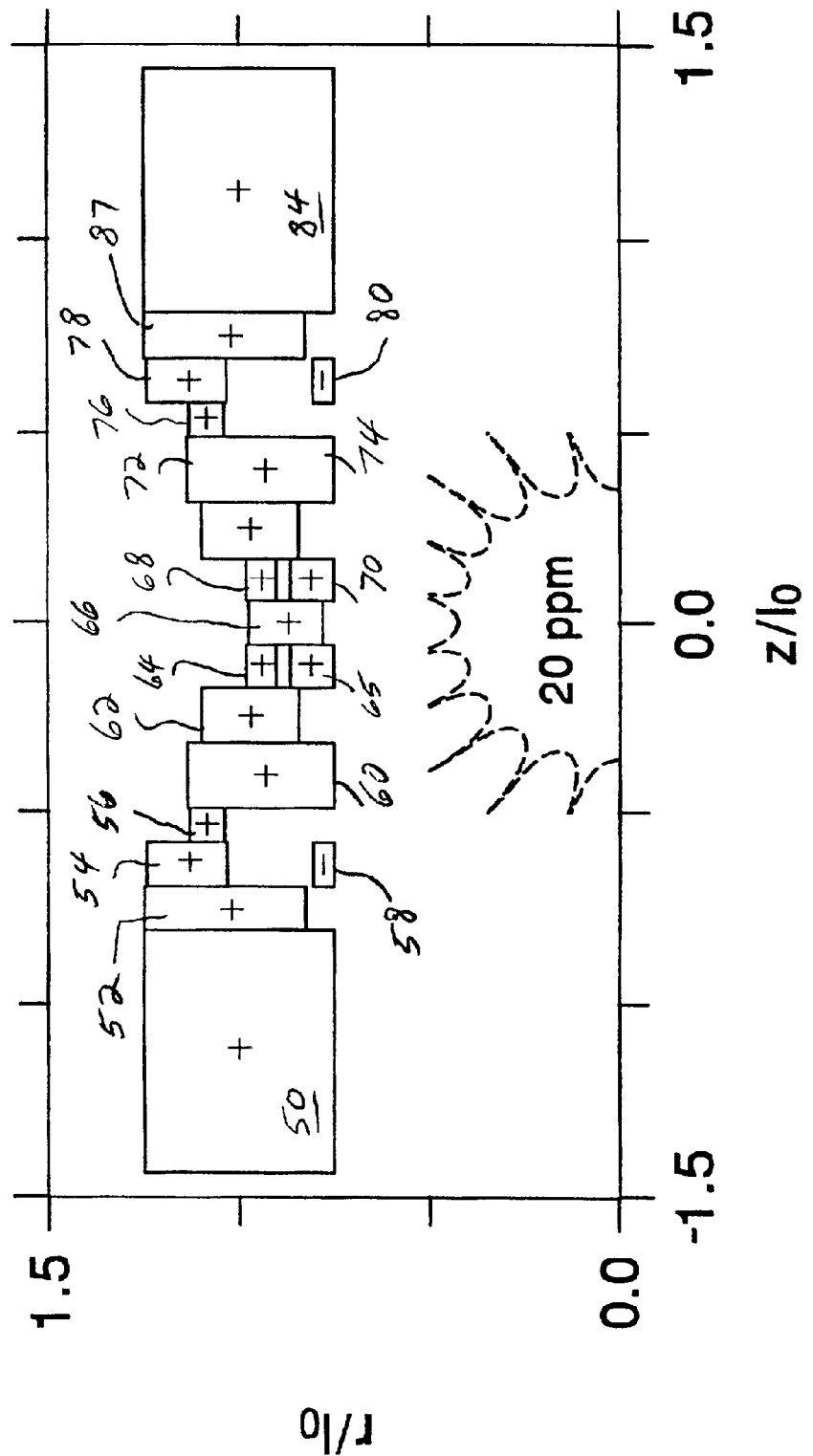
FIG. 5b shows a rectangular coil arrangement with a near minimal power consumption designed in accordance with the invention.

Since the magnitude of the current density $J_0$ is the same for both designs, the arrangement of FIG. 3b, assuming the coils are resistive, requires 9% less power than the Garrett solution. If $J_0$ is allowed to vary, the power consumption can be further reduced. FIG. 5a gives the power consumption for the ideal current density as a function of $J_0$. (For $J_0 \leq 3.5\, B_0/(\mu_0 l_0)$ there is no solution.) The minimum power occurs for $J_0=3.79\, B_0/(\mu_0 l_0)$. This solution has a volume of $V=6.70 l_0^3$ and uses 21% less power than the Garrett solution. A rectangular coil design 50–84 patterned after the minimum power solution is shown in FIG. 5b. The current density magnitude has the same value of $J_0=3.79\, B_0/(\mu_0 l_0)$, while the volume and power consumption are about 1% greater. In two of the coils, the direction of the current is reversed indicated by the minus symbol. The dimensions of the coils are indicated in Table II.

B. Actively Shielded Superconducting Magnet

Figure 7A:
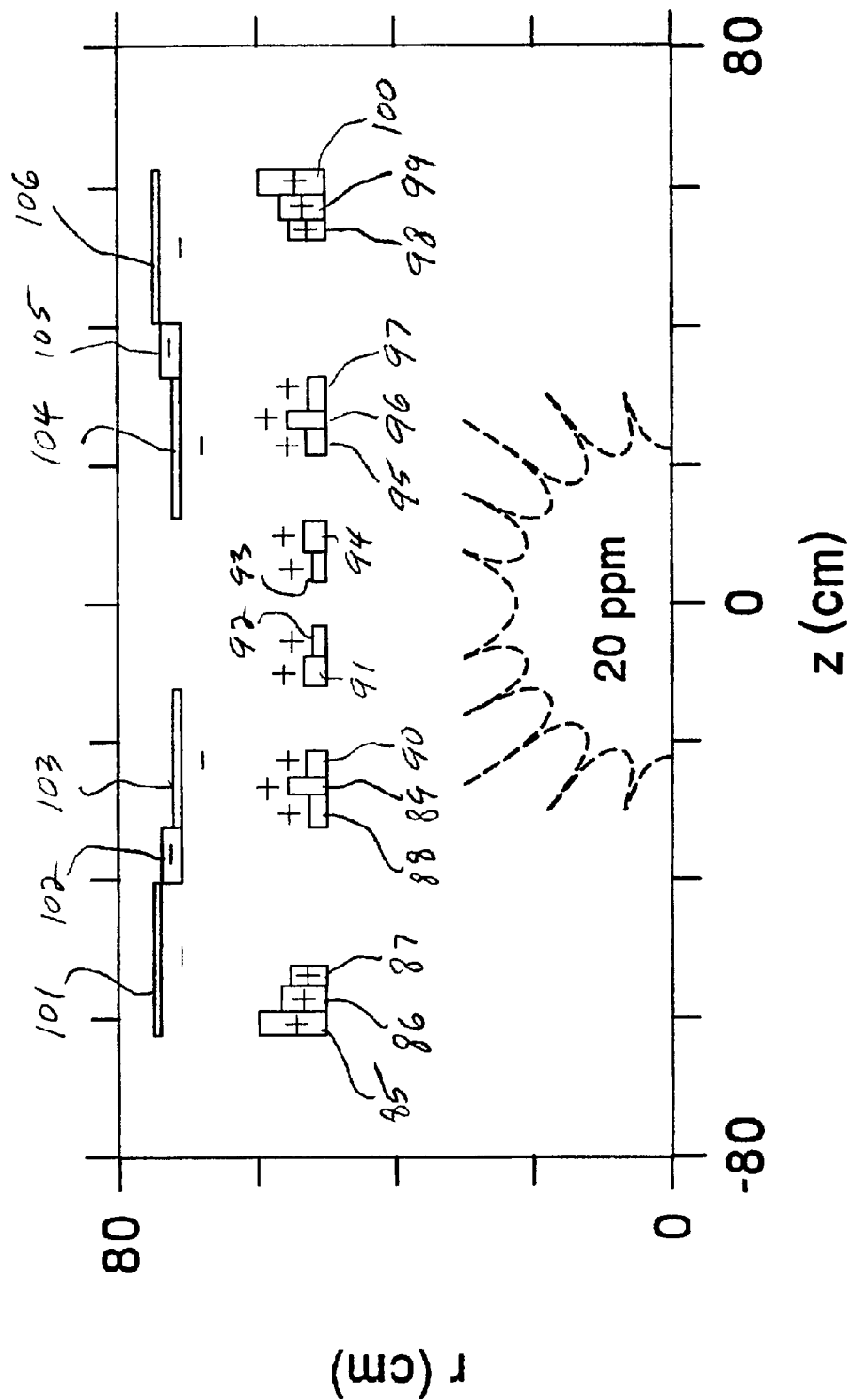
FIG. 7a illustrates a coil design according to the invention of a superconducting magnet where $J_0 = 12{,}000$ A/cm$^2$.
Figure 7B:
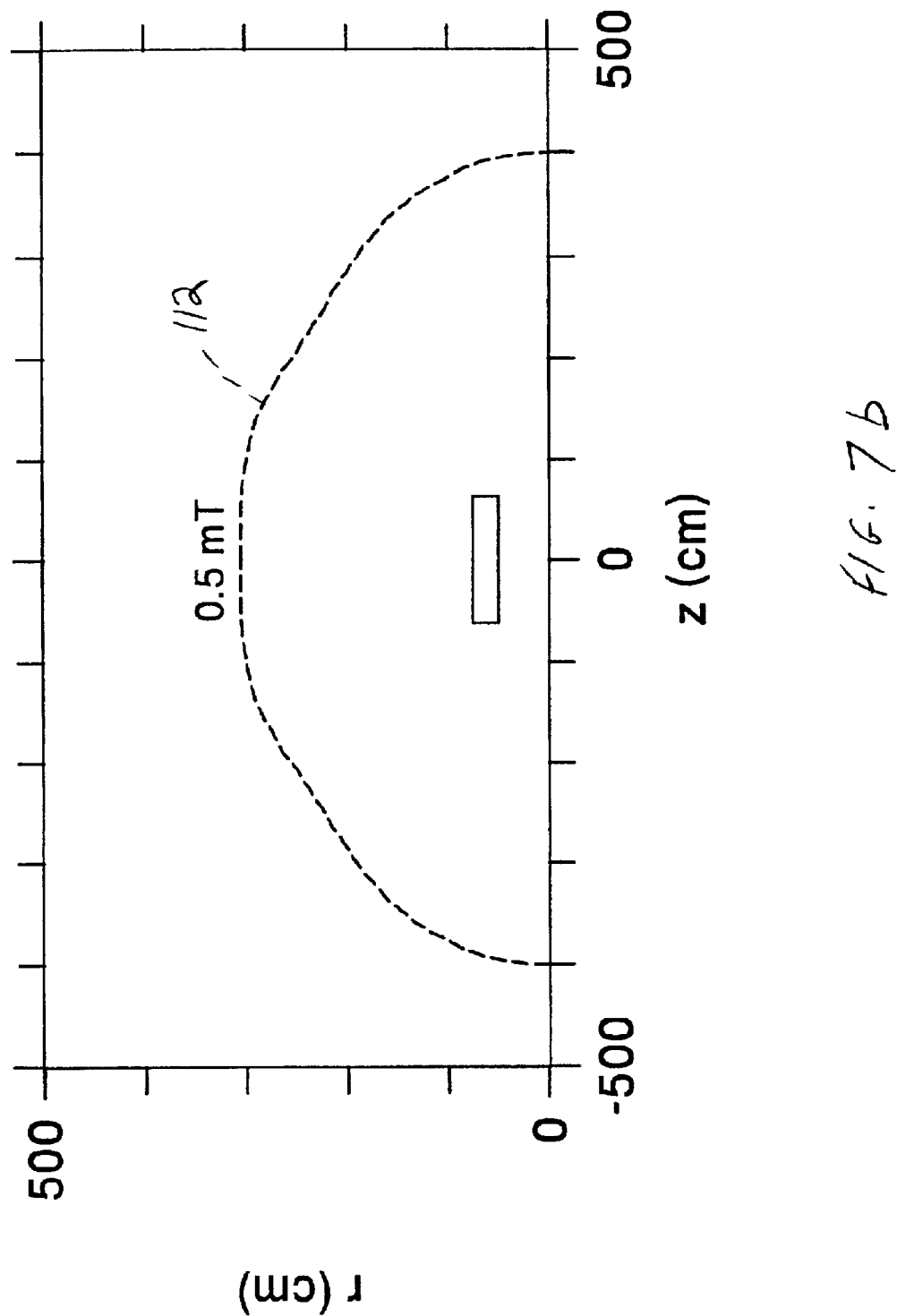
FIG. 7b shows that active shielding generated by the reversed current coils in accordance with the invention limits the 0.5 mT fringe field to a distance of 400 cm from the magnet's center.

I now consider optimizing a magnet 110 with an inner radius of 50 cm, an outer radius of 75 cm, and a total length of 125 cm as shown by the rectangle of FIG. 7b. I set $B_0=1.0$ T and require the homogeneous volume to have a diameter of 45 cm, with a peak-to-peak field variation of less than 20 ppm. The magnitude of the fringe field 112 is restricted to be less than 0.5 mT (5 G) for distances greater than 400 cm from the center of magnet. These specifications are typical for a compact superconducting magnet designed for medical MRI, S. Crazier and D. M. Doddrell, "Compact MRI magnet design by stochastic optimization," J. Magn. Reson., vol. 127, pp. 233–237, 1997 ("Crazier").

Figure 6:
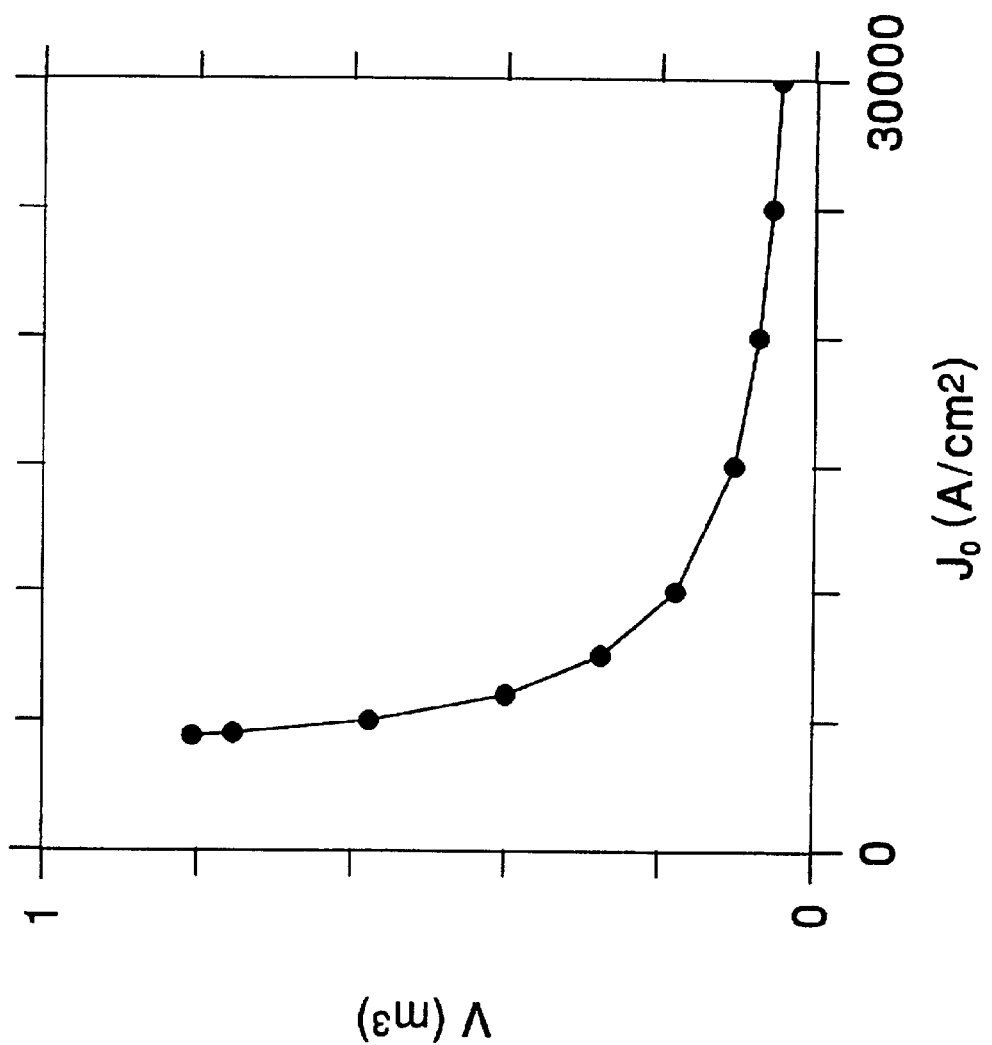
FIG. 6 is a plot of minimum coil volume vs. $J_0$ for a superconducting magnet designed in accordance with the invention.

In FIG. 6, the minimum coil volume V is plotted as a function of the current density magnitude $J_0$; for $J_0 < 4000$ A/cm$^2$, no solution is possible. A near-ideal solution with rectangular coils 85–106 and $J_0=12{,}000$ A/cm$^2$ is shown in FIG. 7a. Step 1 of the calculation used $M_h=37$ and $M_f=2$; steps 3 and 4 used $N_h=17$ and $N_f=5$. The coil volume is 0.152 m$^3$, which is about 7% above the minimum value. The coil parameters are listed in Table III.

VII. REMARKS

I have given a systematic method for efficiently and accurately determining minimum volume coil arrangements. The method uses linear programming to obtain a coarse-grained solution and then refines this solution by solving a nonlinear system of equations. A key feature of the method is that it always yields the global minimum. I have also shown that the method can be adapted to the minimization of the power consumption of resistive magnets.

A limitation of the method is that it assumes a linear relationship between the current density and the magnetic field, which excludes magnets containing material with nonlinear magnetic properties. In addition, it does not allow one to include constraints on the mechanical stresses, which may be important for high field magnets, since stresses depend nonlinearly on the current density.

As I have shown, minimum volume coil arrangements can, in principle, be determined just by employing linear programming techniques. The motivation for introducing the nonlinear system of equations is that standard linear programming algorithms become impractical for dense numerical grids. A possible alternative to solving the nonlinear system would be to use linear programming in combination with an adaptive grid in order to reduce the required number of grid points.

VIII. SUMMARY

The core of the invention is that an electromagnet coil arrangement obtained by solving Eq. (25) for the $\lambda_j$ and using these computed values in Eq. (14) to determine the current density J will require a smaller volume of material (wire) than any other arrangement that satisfies the same prescribed conditions. The prescribed conditions are: 1) the coils must have a homogeneous current density magnitude, $J_0$, as dictated by Eq. (8); 2) the coils are restricted to lie within the feasible volume as fixed by the domain D; 3) the selected M harmonic coefficients, $c_m$, of the magnetic field generated by the coils must have fixed values. ($c_1=B_0$, the desired field strength in the imaging region).

Associated with every harmonic is a function $g_j(r, z)$, which is related to the current density and the harmonic coefficients through Eq. (13). The precise form of the $g_j(r, z)$ depends on the type of harmonics chosen to expand the magnetic field. The most common choice is spherical harmonics, which corresponds to the expansions of Eqs. (16) and (17). For this case, the $g_j(r, z)$ are given by Eq. (21). However, the invention can also be utilized with other types of harmonics, including spheroidal and ellipsoidal; the only change required is the replacement of Eq. (21) with expressions that are readily derivable by one skilled in the art.

The harmonic coefficients $c_m$ may be fixed in one of two ways. The simplest and most conventional procedure is to set all the harmonic coefficients to zero, except $c_1$ which represents the field strength $B_0$. This approach, referred to as harmonic cancellation, allows for an adequate control of the field uniformity in the imaging region and, if desired, the fringe field. A second method, which is the preferred embodiment of the invention, is to choose a set of target points some of which lie on the surface of the imaging region, as suggested by FIG. 1, and optionally, some of which lie outside the coils in the fringe field region. At these points, a set of inequality constraints are applied to the field as indicated by Eqs. (5) and (6). One then applies linear programming, as has been described, to obtain a coarse-grained solution for the current density subject to the conditions of Eqs. (5), (6), and (12). By coarse-grained, it is meant that the numerical grid representing the domain D has a relatively small number of points (less than about one thousand). (It should be emphasized the target points and grid points are distinct and have no particular relationship.) Note that the harmonics do not enter at all into the computation of the coarse-grained solution. However, once the coarse-grained solution has been found, it can be used together with Eq. (2) to calculate the magnetic field. From the magnetic field, the harmonic coefficients may be determined by standard and well-known mathematical procedures. The advantage of this approach, as compared to harmonic cancellation, is that the shape of the imaging region and the fringe field can be much more precisely fixed. Linear programming is not used to find a detailed form for the current density, because this technique becomes impractical if the domain D is represented with a dense grid consisting of many thousands of points.

Once the harmonic coefficients are fixed, then the system of nonlinear equations described by Eq. (25) may be solved for the $\lambda_j$ by utilizing one of several standard numerical methods. One method has been described above, and others are discussed in Ref. 5. In order to obtain an accurate solution, the domain D is represented with a dense grid. Typically, the number of grid points will be a least several thousand and often many tens of thousands. This is the central step of the numerical procedure and requires the largest amount of computational time. A key advantage of solving Eq. (25) is that the computational time grows only linearly with the number of grid points, which makes the use of dense grids feasible.

After Eq. (25) has been solved for the $\lambda_j$, the coils corresponding to the ideal solution for the current density, which minimizes the volume, are easily obtained by utilizing Eq. (14) to make a plot of J(r, z). The number of coils and their shapes are fully determined by the mathematical procedure rather being given a priori.

In order to simplify fabrication, it is sometimes desirable to have coils with rectangular cross-sections. When this is the case, one partitions the domain D in manner patterned after the ideal solution. One then solves Eq. (25) once again, but with the functions $g_j(r, z)$ replaced by the functions $\bar{g}_j(r, z)$ as defined by Eq. (37). The solution obtained will require only slightly more material than the ideal current density.

For resistive magnets, one may wish to minimize the power consumption, rather than the volume, of the coils. To accomplish this, the ideal minimum volume solution is computed for a range of current density magnitudes $J_0$ and the total power consumption W is calculated for each solution with the aid of Eq. (42). Provided a sufficiently broad range of current density magnitudes is selected, the solution with the smallest value of W will require less power than any other coil arrangement that satisfies the same basic conditions. These conditions are: 1) the coils must have a homogeneous current density magnitude, as dictated by Eq. (8), but $J_0$ need not be prescribed; 2) the coils are restricted to lie within the feasible volume as fixed by the domain D;

3) the selected M harmonic coefficients, $c_m$, of the magnetic field generated by the coils must have fixed values.

The preferred method of the invention is reformulated below in the following sequence of steps:

I. Select feasible volume for the coils.

II. Select desired current density magnitude for the coils.

III. Select desired magnetic field level for the imaging region.

IV. Select the harmonics to be canceled for the imaging region or select target points about the imaging region.

V. (Optional, if reduction in the fringe field is desired.) Select the harmonics to be canceled for the fringe field region or select target points in the fringe field region.

VI. If target points are used, apply linear programming with the constraints of Eqs. (5), (6), and (12) in order to compute a coarse-grained solution for the current density. From this solution determine values for the harmonic coefficients.

VII. Compute the solution to the master Eq. (25) for a set of parameters $\lambda_j$.

VIII. Substitute solution for the $\lambda_j$ into the standard form as per Eq. (14) to give the ideal current density.

IX. (Optional, if rectangular coils are desired.) Partition the domain D into rectangular subregions. Replace the functions $g_j(r, z)$ with $\bar{g}_j(r, z)$ as defined by Eq. (37). Repeat steps VII and VIII.

X. (Optional, if power minimization is desired.) Repeat steps I–VIII for a range of current density magnitudes. Compute power consumption for each case. The one with the minimum power corresponds to the best current density. If desired, repeat step IX to obtain rectangular coils.

In computing the solution to Eq. (25), the various variables and constants include the following (the underline (_) signifies that the next following character(s) are subscripts to the preceding character):

M=number of harmonics selected (controlled), including the fundamental and the fringe field harmonics;

lambda_j=a set of M+1 parameters that determine the ideal current density configuration for the coil arrangement as set forth in Eq. (14);

J_0=the desired current density magnitude;

c_m=set of M desired values for the harmonics;

c_1=is the field level at the center of the region of interest; for harmonic cancellation, the c_m are zero for m>1;

r=the radial coordinate of a cylindrical coordinate system having (r, z, $\phi$) coordinates;

z=the axial coordinate of the cylindrical coordinate system;

D=the region of an rz plane corresponding to the feasible volume of the imaging region;

Theta( )=the standard mathematical step function defined by Eq. (15);

g_j( )=constraint functions that depend on the choice of the type of harmonics to be cancelled (e.g., spherical, ellipsoidal, etc.). For spherical harmonics, they are given by Eq. (21).

P_j( )=the standard mathematical Legendre polynomials (in Eq. (21));

mu_0=the magnetic permeability of free space (in Eq. (21));

The results described above were obtained with a conventional PC system using a 400 MHz processor and a software package that was the equivalent of common math programs available commercially. The processing times were approximately 60 minutes for all the steps to arrive at FIG. 3b.

It will also be appreciated that there are many known computer techniques to compute solutions to equations involving many iterations before the roots representing the solution are obtained. For more details, the reader is referred to the references cited in Appendix B and the references referred to in those publications that show other schemes to implement such known computer techniques.

While the invention has been described in connection with preferred embodiments, it will be understood that modifications thereof within the principles outlined above will be evident to those skilled in the art and thus the invention is not limited to the preferred embodiments but is intended to encompass such modifications.

Section IX-Mathematical Proofs

Here I sketch the proofs of Theorems 1–3.

A. Proof of Theorem 1

Consider the minimization problem defined in Sec. IIIA. Since U is constrained only by the condition of Eq. (12a), the solution with the minimum volume V' will always have U=|J|. Therefore this minimization problem is equivalent to minimizing V as given by Eq. (9) subject to the conditions of Eqs. (5), (6), and (12b). This shows that to verify Theorem 1, I need only demonstrate that the condition of Eq. (12b) may be replaced with the condition of Eq. (8).

To do this, I first reformulate Eqs. (5) and (6). Define $$d_j^{\pm}=(1\pm\epsilon)B_0, \text{ for } 1\leq j\leq M_h,$$

$$d_j^{\pm}=\pm B_{z,f}, \text{ for } M_h+1\leq j\leq M_h+M_f,$$

$$d_j^{\pm}=\pm B_{r,f}, \text{ for } M_h+M_f+1\leq j\leq M_h+2M_f, \quad (A1)$$

and $$h_j(r, z)=G_z(r_j, r, z_j-z), \text{ for } 1\leq j\leq M_h+M_f,$$

$$h_j(r, z)=G_r(r_j, r, z_j-z), \text{ for } M_h+M_f+1\leq j\leq M_h+2M_f \quad (A2)$$

With the help of Eq. (2), the conditions of Eqs. (5) and (6) may be then be expressed as $$d_j^- \leq 2\pi\int_D rdrdz\, h_j(r, z)J(r, z) \leq d_j^+, \text{ for } 1\leq j\leq M_h+2M_f \quad (A3)$$

Now suppose I have a solution for J that minimizes V while satisfying Eqs. (12b) and (A3). I may then divide the domain D into two regions, $D_a$ and $D_b$, so that Eq. (8) is satisfied in $D_a$ and violated in $D_b$. Consider shifting J to J'=J+δJ, where δJ is an arbitrary infinitesimal variation with the properties $$\delta J(r, z)=0, \text{ if } (r, z)\in D_a, \quad (A4)$$

and $$\int_{D_b} rdrdz\, h_j(r, z)\delta J(r, z)=0, \text{ for } 1\leq j\leq M_h+2M_f \quad (A5)$$

From Eq. (9), the change in V is seen to be $$\delta V = \frac{2\pi}{J_0}\int_{D_b} rdrdz\, \frac{J(r, z)}{|J(r, z)|}\delta J(r, z). \quad (A6)$$

Because of Eqs. (A4) and (A5), J' also satisfies Eqs. (12b) and (A3). Since by assumption J minimizes V, I must have $$\delta V \geq 0. \quad (A7)$$

However, as follows from Eqs. (A4) and (A5), if δJ is an allowed variation, then so is −δJ. Because δV is linear in δJ, Eq. (A7) can hold only if $$\delta V=0. \quad (A8)$$

There are only two ways of satisfying Eq. (A8) for all allowed δJ. Either the volume associated with $D_b$ is zero or, as follows from Eq. (A5), $$\frac{J(r, z)}{|J(r, z)|} = \sum_{j=1}^{M_h+2M_f} \alpha_j h_j(r, z), \quad (A9)$$

for a set of points in $D_b$ of nonzero measure with the coefficients $\alpha_j$ not all being zero. Equation (A9) leads to $$1 = \left(\sum_{j=1}^{M_h+2M_f} \alpha_j h_j(r, z)\right)^2. \quad (A10)$$

The function on the right side of Eq. (A10) is analytic in the variable z. A standard theorem of analytic functions then indicates that if Eq. (A10) holds for a dense set of z values, then it must hold for all z values R. V. Churchhill, J. W. Brown, and R. F. Verhey, *Complex Variables and Applications*. New York: McGraw-Hill, 1974, pp. 286–287 ("Churchill"). However, with the aid of Eqs. (3), (4), and (A2), one can show that the right side of Eq. (A10) vanishes as z→∞. I then conclude that Eq. (A10), and hence Eq. (A9), cannot be satisfied on a dense set of points, and therefore the volume associated with $D_b$ must be zero. From this it follows that $D_a$=D (except possibly for a set points of zero measure) and that the condition of Eq. (12b) may be replaced with the stricter condition of Eq. (8).

B. Proof of Theorem 2

As discussed above, the ideal current density may be found by minimizing the volume V given by Eq. (9) subject to the conditions of Eqs. (12b) and (A3). Now suppose I have two current densities $J_1$ and $J_2$, both of which yield the minimum possible volume and obey Eqs. (12b) and (A3). Since they are linear, Eqs. (12b) and (A3) are also satisfied by $J_3=(J_1+J_2)/2$. Because $J_1$ and $J_2$ are both minimum volume solutions, Eq. (9) implies $$\int_D rdrdz|J_3(r, z)| \geq \frac{1}{2}\int_D rdrdz[|J_1(r, z)| + |J_2(r, z)|]. \quad (A11)$$

This may be rewritten as $$\int_D rdrdz|J_1(r, z)+J_2(r, z)| \geq \int_D rdrdz[|J_1(r, z)|+|J_2(r, z)|]. \quad (A12)$$

For any two number $x_1$ and $x_2$, I have $|x_1+x_2|\leq|x_1|+|x_2|$. Therefore, $$\int_D rdrdz|J_1(r, z)+J_2(r, z)| \leq \int_D rdrdz[|J_1(r, z)|+|J_2(r, z)|]. \quad (A13)$$

For both Eqs. (A12) and (A13) to hold requires that $$\int_D rdrdz|J_1(r, z)+J_2(r, z)| = \int_D rdrdz[|J_1(r, z)|+|J_2(r, z)|]. \quad (A14)$$

from which it follows that $J_3$ is also a minimum volume solution. From the condition of Eq. (8), I then find that $$|J_1(r, z)|=J_0 \text{ or } 0,$$

$$|J_2(r, z)|=J_0 \text{ or } 0,$$

$$|J_1(r, z)+J_2(r, z)|=2J_0 \text{ or } 0. \quad (A15)$$

Equation (A15) can be satisfied if and only if $|J_1|=|J_2|$.

Now divide D into three parts, $D_0$, $D_+$ and $D_-$, so that $J_1J_2=0$ in $D_0$, $J_1J_2=J_0^2$ in $D_+$, and $J_1J_2=-J_0^2$ in $D_-$. From Eq. (A14), one may then show that $$2J_0\int_{D_-} rdrdz=0, \quad (A16)$$

which implies that the volume associated with $D_-$ is zero. I then conclude that $J_1 = J_2$ and hence that the ideal current density is unique.

C. Proof of Theorem 3

Any function J that satisfies Eq. (8) can be uniquely decomposed as $$J(r, z) = \frac{1}{2}[J^+(r, z) - J^-(r, z)], \tag{A16}$$

where $J^+$ and $J^-$ have the properties $$|J^+(r, z)| = |J^-(r, z)| = J_0 \tag{A17}$$

and $$J^+(r, z) = J^-(r, z) = J_0, \text{ whenever } J^+(r, z) \cdot J^-(r, z) > 0. \tag{A18}$$

One may demonstrate that $$2\pi \int_D r dr dz [J^+(r, z) + J^-(r, z)] = 2J_0(V_0 - V), \tag{A19}$$

where $V_0$ is the total feasible volume defined by Eq. (30). When the current density has the form of Eq. (14), I have the explicit expression $$J^\pm(r, z) = J_0 \frac{\lambda_0 \pm \sum_{j=1}^{M} \lambda_j g_j(r, z)}{\left|\lambda_0 \pm \sum_{j=1}^{M} \lambda_j g_j(r, z)\right|}, \tag{A20}$$

where it is assumed that $\lambda_0 \geq 0$.

Now consider two current densities, $J_1$ and $J_2$. Both satisfy the conditions of Eqs. (8) and (13), but require amounts of superconducting material, $V_1$ and $V_2$, that are not necessarily equal. I also assume $J_1$ has the form of Eq. (14). By using Eqs. (13), (14), (A16), (A19) and (A20), one may show that $$2\pi \int_D r dr dz \{w^+(r, z) J_1^+(r, z) [J_2^+(r, z) - J_1^+(r, z)] + w^-(r, z) J_1^-(r, z) [J_2^-(r, z) - J_1^-(r, z)]\} = 2\lambda_0 J_0^2 (V_1 - V_2), \tag{A21}$$

where $$w^\pm(r, z) = \left|\lambda_0 \pm \sum_{j=1}^{M} \lambda_j g_j(r, z)\right|. \tag{A22}$$

The identity $$[J_2^+(r, z) - J_1^+(r, z)]^2 = -2J_1^+(r, z)[J_2^+(r, z) - J_1^+(r, z)], \tag{A23}$$

may be verified with the help of Eq. (A17). Combining Eqs. (A21) and (A23) yields $$V_2 - V_1 = \frac{\pi}{2\lambda_0 J_0^2} \int_D r dr dz \{w^+(r, z)[J_2^+(r, z) - J_1^+(r, z)]^2 + w^-(r, z)[J_2^-(r, z) - J_1^-(r, z)]^2\}. \tag{A24}$$

Since $w^+$ and $w^-$ are both nonnegative, Eq. (A24) demonstrates that $V_2 \geq V_1$, provided $\lambda_0 \neq 0$. Therefore, any current density of the form of Eq. (14) that obeys the constraints of Eq. (13) yields the minimum possible volume for the coils.

The case with $\lambda_0 = 0$ requires special treatment. For this value of $\lambda_0$, Eq. (14) reduces to $$J(r, z) = J_0 \frac{\sum_{j=1}^{M} \lambda_j g_j(r, z)}{\left|\sum_{j=1}^{M} \lambda_j g_j(r, z)\right|}, \tag{A25}$$

which implies that the current density is nonzero throughout D and that V takes on the maximum allowed value of $V_0$. Now let $J_1$ and $J_2$ be two current densities that both satisfy Eqs. (8) and (13), but with current densities, $J_0$ and $J_0'$, that are not necessarily the same. If $J_1$ has the form (A25), then from Eq. (13) one can show $$2\pi \int_D r dr dz \, w(r, z) J_1(r, z)[J_2(r, z) - J_1(r, z)] = 0, \tag{A26}$$

where $$w(r, z) = \left|\sum_{j=1}^{M} \lambda_j g_j(r, z)\right|. \tag{A27}$$

Equation (A26) implies $$\int_D r dr dz \, w(r, z)[|J_2(r, z)|^2 - |J_1(r, z)|^2] = \int_D r dr dz \, w(r, z)[J_2(r, z) - J_1(r, z)]^2. \tag{A28}$$

As $w \geq 0$ Eq. (A28) can be obeyed only if $J_0' \geq J_0$. Therefore, the solution of the form of Eq. (14) with $\lambda_0 = 0$ yields a lower bound on the possible values of the current density magnitude.

SECTION X

TABLE I

| Coil | Ref. #s | $r_{in}/l_O$ | $z_{in}/l_O$ | $r_{out}/l_O$ | $z_{out}/l_O$ |
|---|---|---|---|---|---|
| 1 | 29 | 0.76388 | 0.000000 | 0.93284 | 0.028839 |
| 2 | 28, 30 | 0.75000 | 0.028839 | 0.93936 | 0.173034 |
| 3 | 27, 32 | 0.78625 | 0.173034 | 0.97950 | 0.302810 |
| 4 | 26, 34 | 0.75000 | 0.302810 | 1.01034 | 0.533522 |
| 5 | 24, 36 | 0.84988 | 0.533522 | 0.96372 | 0.576780 |
| 6 | 22, 38 | 0.83395 | 0.692136 | 1.04975 | 0.764234 |
| 7 | 20, 40 | 0.75000 | 0.764234 | 1.13520 | 1.441950 |

TABLE II

| Coil | Ref. #s | $r_{in}/l_O$ | $z_{in}/l_O$ | $r_{out}/l_O$ | $z_{out}/l_O$ |
|---|---|---|---|---|---|
| 1 | 66 | 0.779282 | 0.000000 | 0.975656 | 0.057678 |
| 2 | 65, 70 | 0.750000 | 0.057678 | 0.864906 | 0.173034 |
| 3 | 64, 68 | 0.903295 | 0.057678 | 0.980599 | 0.173034 |
| 4 | 62, 72 | 0.843715 | 0.173034 | 1.100900 | 0.317229 |
| 5 | 60, 74 | 0.750000 | 0.317229 | 1.137249 | 0.490263 |
| 6 | 56, 76 | 1.038761 | 0.490263 | 1.132065 | 0.576780 |
| 7* | 58, 80 | 0.750000 | 0.576780 | 0.805958 | 0.692136 |
| 8 | 54, 78 | 1.032825 | 0.576780 | 1.244227 | 0.692136 |
| 9 | 52, 87 | 0.825623 | 0.692136 | 1.250000 | 0.807492 |
| 10 | 50, 84 | 0.750000 | 0.807492 | 1.250000 | 1.441950 |

TABLE III

| Coil | Ref. #s | $r_{in}$ (cm) | $z_{in}$ (cm) | $r_{out}$ (cm) | $z_{out}$ (cm) |
|---|---|---|---|---|---|
| 1 | 92, 93 | 50.02110 | 3.2000 | 51.99120 | 7.6000 |
| 2 | 91, 94 | 50.00000 | 7.6000 | 53.26395 | 12.0000 |
| 3 | 90, 95 | 50.00000 | 21.4000 | 52.88210 | 25.4000 |
| 4 | 89, 96 | 50.00000 | 25.4000 | 55.58195 | 27.8000 |

TABLE III-continued

| Coil | Ref. #s | $r_{in}$ (cm) | $z_{in}$ (cm) | $r_{out}$ (cm) | $z_{out}$ (cm) |
|---|---|---|---|---|---|
| 5 | 88, 97 | 50.00000 | 27.8000 | 52.54305 | 32.6000 |
| 6 | 87, 98 | 50.00000 | 52.5000 | 55.31125 | 55.5000 |
| 7 | 86, 99 | 50.10855 | 55.5000 | 56.57000 | 59.0000 |
| 8 | 85, 100 | 50.05885 | 59.0000 | 59.80405 | 62.5000 |
| 9* | 103, 104 | 71.00000 | 12.5000 | 72.27680 | 32.5000 |
| 10* | 102, 105 | 71.05000 | 32.5000 | 73.92415 | 40.5000 |
| 11* | 101, 106 | 74.03320 | 40.5000 | 75.00000 | 62.5000 |

What is claimed is:

1. A computer-implemented method for designing an electromagnetic coil arrangement that generates a uniform magnetic field in a desired region, said electromagnetic coil arrangement having a number of coils and a shape defined by r and z, where r is the radial coordinate of a cylindrical coordinate system having (r, z, φ) coordinates, and z is the axial coordinate of the cylindrical coordinate system; comprising the steps:

(a) computing a solution to Eq. (25) as defined in the accompanying specification for a set of parameters lambda_j under the conditions recited in Eqs. (5), (6), and (8) of the accompanying specification, (b) using a computer, numerically evaluating Eq. (14) as defined in the accompanying specification using the set of parameters lambda_j computed in step (a) to obtain an ideal current density J(r, z) for the electromagnetic coil arrangement to generate a desired magnetic field intensity, (c) plotting J as a function of r and z as computed in step (b) to obtain the number of coils and the shape of the electromagnetic coil arrangement to determine its geometry.

2. A computer-implemented method for designing an electromagnetic coil arrangement that generates a uniform magnetic field in a desired region as set forth in claim 1, wherein the desired region is an imaging region of interest for a magnetic resonance imaging system, and step (b) reformulates the set of parameters lambda_j computed in step (a) into the standard form of Eq. (14) to give the ideal current density for a selected coil feasible volume producing in the imaging region a selected magnetic field intensity.

3. A computer-implemented method for designing an electromagnetic coil arrangement that generates a uniform magnetic field in a desired region as set forth in claim 2, further comprising the step:

(d) numerically evaluating Eq. (9) as defined in the accompanying specification using the result obtained in step (c) to determine the minimum coil volume of the electromagnetic coil arrangement.

4. A computer-implemented method for optimizing the design of an electromagnetic coil arrangement that generates a uniform magnetic field in a desired region, said electromagnetic coil arrangement having a number of coils and a shape defined by r and z, where r is the radial coordinate of a cylindrical coordinate system having (r, z, φ) coordinates, and z is the axial coordinate of the cylindrical coordinate system; comprising the steps:

(a). Select a feasible volume for the coils, (b). Select a desired current density magnitude for the coils, (c). Select a desired magnetic field level for the desired region, (d). Select the number and values of harmonics to be controlled in the desired region, (e) computing a solution to Eq. (25) as defined in the accompanying specification for a set of parameters lambda_j, (f) reformulating the solution to Eq. (25) to the standard form of Eq. (14) as defined in the accompanying specification using the set of parameters lambda_j computed in step (f) to obtain an ideal current density J(r, z) for the electromagnetic coil arrangement which generates an approximation of the desired magnetic field level, (g) plotting J as a function of r and z as computed in step (g) to obtain the number of coils and the shape of the electromagnetic coil arrangement to determine its geometry.

5. A computer-implemented method for optimizing the design of electromagnetic coil arrangements that generate uniform magnetic fields in a region of interest for a magnetic resonance imaging system as set forth in claim 4, wherein computing a solution to Equation (25) in step (f) for a set of parameters lambda_j involves the following constants and variables wherein:

M=number of harmonics controlled, including the fundamental and the fringe field harmonics;

lambda_j=a set of M+1 parameters that determine the ideal current density configuration for the coil arrangement as set forth in Equation (14);

J_0=the desired current density magnitude;

c_m=set of M desired values for the harmonics;

c_1=is the field level at the center of the region of interest; for harmonic cancellation, the c_m are zero for m>1;

r=the radial coordinate of a cylindrical coordinate system having (r, z, φ) coordinates;

z=axial coordinate of the cylindrical coordinate system;

D=the region of an rz plane corresponding to the feasible volume of the region of interest;

Theta( )=the standard mathematical step function defined by Equation (15);

g_j( )=constraint functions that depend on the choice of the type of harmonics to be cancelled (e.g., spherical, ellipsoidal, etc.). For spherical harmonics, they are given by Equation. (21);

P_j( )=the standard mathematical Legendre polynomials (in Equation (21));

mu_0=the magnetic permeability of free space (in Equation (21)).

6. A computer-implemented method for optimizing the design of electromagnetic coil arrangements that generate uniform magnetic fields in a region of interest for a magnetic resonance imaging system as set forth in claim 4, wherein the electromagnetic coil to be designed comprises plural turns each having a given current that is the same for all the turns, the turns are connected in series with a uniform wire size and turn density, the coils are restricted to lie within the feasible volume, the magnetic field in the imaging region depends linearly on the current density, and the characteristics of the field including its magnitude and uniformity may be fixed by controlling a set of harmonics.

7. A computer-implemented method for optimizing the design of an electromagnetic coil arrangement that generates a uniform magnetic field in a desired region, said electromagnetic coil arrangement having a number of coils and a shape defined by r and z, where r is the radial coordinate of a cylindrical coordinate system having (r, z, φ) coordinates, and z is the axial coordinate of the cylindrical coordinate system; comprising the steps:

I) Select a feasible volume for the coils;

II) Select a desired current density magnitude for the coils;

III) Select a desired magnetic field level for the imaging region;

IV) Select the harmonics to be canceled for the imaging region or select target points about the imaging region;

V) If reduction in a fringe field is desired, select the harmonics to be canceled for the fringe field region or select target points in the fringe field region;

VI) If target points are used, apply linear programming with the constraints of Eqs. (5), (6), and (12) as set forth in the accompanying specification and compute a coarse-grained solution for the current density, and from this solution determine values for the harmonic coefficients of the field;

VII) Compute the solution to the master Eq. (25) as set forth in the accompanying specification for a set of parameters lambda_j;

VIII) Substitute the solution of step VII for the lambda_j into the standard form as per Eq. (14) as set forth in the accompanying specification to give the ideal current density;

IX) If rectangular coils are desired, partition the domain D into rectangular subregions, and replace the functions $g_j(r, z)$ with $g_j(r, z)$ as defined by Eq. (37) as set forth in the accompanying specification, and repeat steps VII and VIII;

X) If power minimization is desired, repeat steps I–VIII for a range of current density magnitudes, and compute power consumption for each case, and chose the one with the minimum power for the corresponding current density;

XI) If rectangular coils are desired, repeat step IX to obtain rectangular coils.

8. A computer-implemented method for optimizing the design of electromagnetic coil arrangements that generate uniform magnetic fields in a region of interest for a magnetic resonance imaging system as set forth in claim 7, wherein in step VIII, use a number of target points less than one thousand.

9. A computer-implemented method for optimizing the design of electromagnetic coil arrangements that generate uniform magnetic fields in a region of interest for a magnetic resonance imaging system as set forth in claim 7, if additional computation is desired to increase the accuracy of the coil arrangement, use a number of target points greater than several thousand.

10. A computer-implemented method for optimizing the design of electromagnetic coil arrangements that generate uniform magnetic fields in a region of interest for a magnetic resonance imaging system as set forth in claim 7, wherein the electromagnetic coil is a superconductive coil whose volume is minimized.

11. A computer-implemented method for optimizing the design of electromagnetic coil arrangements that generate uniform magnetic fields in a region of interest for a magnetic resonance imaging system as set forth in claim 7, wherein the electromagnetic coil is a resisitive coil whose power consumption is minimized.

12. A superconductive coil arrangement for use in MRI designed by the method of claim 4.

13. A resisitive coil arrangement for use in MRI designed by the method of claim 7.

14. A rectangular coil arrangement for use in MRI designed by the method of claim 7.

* * * * *